US012578387B2

(12) United States Patent
Langovsky et al.

(10) Patent No.: US 12,578,387 B2
(45) Date of Patent: Mar. 17, 2026

(54) SYSTEMS AND METHODS FOR FAULT DETECTION, DIAGNOSIS, AND RECOVERY IN AN ELECTROMECHANICAL ACTUATOR

(71) Applicant: Hitachi Astemo, Ltd., Hitachinaka (JP)

(72) Inventors: Nick Langovsky, Northville, MI (US);
Kevin McGrew, Northville, MI (US);
Terrance Yarmak, Howell, MI (US);
Anthony Robert Catanese, Clinton
Township, MI (US); Steven Little,
Milford, MI (US)

(73) Assignee: Hitachi Astemo, Ltd., Hitachinaka (JP)

( * ) Notice: Subject to any disclaimer, the term of this
patent is extended or adjusted under 35
U.S.C. 154(b) by 146 days.

(21) Appl. No.: 18/404,328

(22) Filed: Jan. 4, 2024

(65) Prior Publication Data

US 2025/0224451 A1 Jul. 10, 2025

(51) Int. Cl.
| | |
|---|---|
| *G01R 31/34* | (2020.01) |
| *G01R 19/10* | (2006.01) |
| *H02P 29/024* | (2016.01) |
| *H03K 17/687* | (2006.01) |

(52) U.S. Cl.
CPC .......... *G01R 31/343* (2013.01); *G01R 19/10*
(2013.01); *H02P 29/024* (2013.01); *H03K*
*17/687* (2013.01)

(58) Field of Classification Search
None
See application file for complete search history.

(56) References Cited

U.S. PATENT DOCUMENTS

| | | | |
|---|---|---|---|
| 6,593,751 | B2 | 7/2003 | Takahashi |
| 7,157,875 | B2 | 1/2007 | Kamen et al. |
| 7,292,042 | B2 | 11/2007 | Morita et al. |
| 7,362,551 | B2 | 4/2008 | Bax et al. |
| 7,652,858 | B2 | 1/2010 | Tang et al. |
| 7,894,169 | B2 | 2/2011 | Valdez et al. |
| 7,965,085 | B2 | 6/2011 | Blakely |
| 8,018,694 | B1 | 9/2011 | Wu |
| 8,022,658 | B2 | 9/2011 | Ide |

(Continued)

FOREIGN PATENT DOCUMENTS

| | | |
|---|---|---|
| EP | 2 398 141 B1 | 12/2011 |
| EP | 2 415 151 B1 | 2/2012 |

(Continued)

*Primary Examiner* — Jas A Sanghera
(74) *Attorney, Agent, or Firm* — Foley & Lardner LLP

(57) ABSTRACT

Systems and methods are provided for fault detection, diagnosis, and recovery in an electromechanical actuator. The system can include a data processing system having one or more processors and a memory. The data processing system can receive first electrical data from a first sensor positioned at a first terminal of a power source, in addition to second electrical data from a second sensor positioned at a second terminal of the power source. The data processing system can determine a first average value from the first electrical data and a second average from the second electrical data. The data processing system can determine a difference between the first average value and the second average value. The data processing system can detect a fault impedance according to a pattern of the difference over a measured time interval. The data processing system can provide an indication of the fault impedance.

20 Claims, 17 Drawing Sheets

100

(56)                    References Cited

U.S. PATENT DOCUMENTS

| | | | |
|---|---|---|---|
| 8,054,084 B2 | 11/2011 | Schulz et al. | |
| 8,248,010 B2 | 8/2012 | Mukai et al. | |
| 8,279,565 B2 | 10/2012 | Hall et al. | |
| 8,310,272 B2 | 11/2012 | Quarto | |
| 8,354,817 B2 | 1/2013 | Yeh et al. | |
| 8,421,388 B2 | 4/2013 | Mukai | |
| 8,528,689 B2 | 9/2013 | Uryu | |
| 8,547,043 B2 | 10/2013 | Kuroda | |
| 8,618,753 B2 | 12/2013 | Najima et al. | |
| 8,625,244 B2 | 1/2014 | Paik et al. | |
| 8,760,095 B2 | 6/2014 | Iwaji et al. | |
| 8,810,189 B2 | 8/2014 | Singh et al. | |
| 8,878,474 B2 | 11/2014 | Kezobo et al. | |
| 8,941,337 B2 | 1/2015 | Uryu et al. | |
| 8,947,838 B2 | 2/2015 | Yamai et al. | |
| 8,976,551 B2 | 3/2015 | Igarashi et al. | |
| 8,981,704 B2 | 3/2015 | Endo et al. | |
| 9,024,555 B2 | 5/2015 | Hirono | |
| 9,081,041 B2 | 7/2015 | Friedrich et al. | |
| 9,190,836 B2 | 11/2015 | Dent | |
| 9,274,158 B2 | 3/2016 | Tang et al. | |
| 9,291,648 B2 | 3/2016 | Snoeij et al. | |
| 9,310,819 B2 | 4/2016 | Guerra et al. | |
| 9,455,652 B2 | 9/2016 | Ueno et al. | |
| 9,476,916 B2 | 10/2016 | Minagawa | |
| 9,634,587 B2 | 4/2017 | Kikuchi et al. | |
| 9,653,906 B2 | 5/2017 | Sakanobe et al. | |
| 9,978,553 B2 | 5/2018 | Tomimbang et al. | |
| 10,088,531 B2 | 10/2018 | Kuroiwa | |
| 10,097,129 B2 | 10/2018 | Koseki et al. | |
| 2012/0016613 A1* | 1/2012 | Yang | G01R 27/16 |
| | | | 702/65 |
| 2019/0111786 A1* | 4/2019 | Qian | B60L 3/0069 |
| 2022/0399174 A1* | 12/2022 | Telefus | H02H 3/385 |
| 2024/0103094 A1* | 3/2024 | Greither | G01R 31/008 |
| 2024/0201268 A1* | 6/2024 | Kong | H02H 7/18 |

FOREIGN PATENT DOCUMENTS

| | | |
|---|---|---|
| EP | 2 424 064 B1 | 2/2012 |
| EP | 2 791 743 B1 | 10/2014 |
| EP | 2 860 838 B1 | 4/2015 |
| EP | 3 035 523 B1 | 4/2018 |

* cited by examiner

900

SYSTEMS AND METHODS FOR FAULT DETECTION, DIAGNOSIS, AND RECOVERY IN AN ELECTROMECHANICAL ACTUATOR

FIELD

The present application relates generally to fault detection, diagnosis, and recovery in an electromechanical actuator.

BACKGROUND

Certain systems can include an electrical component and a power supply. The electrical component can be powered by the power supply. For example, the power supply can provide electrical power to the electrical component via a power converter. The power converter may be a two-level power converter, or other types of power converter, used for power conversion between the power source and the electrical component. The power converter can control the flow of electrical energy to or from the electrical component to achieve controlled tasks, such as motor control or power inversion, etc.

SUMMARY

In certain systems, a two-level (or two-phase) power converter can be used for power conversion from a power source (e.g., battery, energy storage, or utility grid) to energize circuit components. The circuit component can include but is not limited to an electromechanical actuator (EMA), amplifier, electrical motor, motor driver, or propulsion system, among others. The two-level power converter may sometimes be referred to as an H-bridge, including multiple transistors (e.g., electronic switches) arranged relatively in an H-shape (or in a similar connection scheme). For example, a device (e.g., a microprocessor or a controller) can be configured to control the transistors for managing electrical power to the circuit component, including but not limited to managing the amount of current, the direction of the current, or the "ON" and "OFF" timing of the circuit component. However, in certain scenarios, a relatively irregular condition (e.g., potential fault) may occur within the circuit. The fault may occur due to hardware failure, interference, or disconnection of the circuit wiring, to name a few. In such cases, it may be difficult to detect certain types of faults that occur in the circuit, including overcurrent faults or fault impedance (e.g., low and/or high impedance), and the location of the fault. The systems and methods of the technical solution discussed herein can provide a data processing system to monitor electrical characteristics within the circuit to detect, diagnose, and recover from faults.

The systems and methods can include the data processing system configured to perform a digital pulse width modulation (PWM) technique, such as using a center-aligned digital PWM carrier for the power converter circuit. Two sensors (e.g., current sensors or other electrical sensors) can be implemented including a first sensor positioned/placed in the power feed (e.g., positive power rail of a power source) and a second sensor positioned in the return feed (e.g., negative power rail of the power source). The current sensors can sense one or more electrical properties and provide electrical data to the data processing system. The signals from these sensors can be sampled simultaneously and converted to digital form by using, for instance, respective analog-to-digital converters (ADCs). The data processing system can filter (or select a subset of) the signals from the ADCs using adjustable trigger windows, including width adjustment or position (e.g., time) adjustment. The data processing system can adjust the trigger window to account for nonidealities of the power converter, such as slew rates, inserted power device blanking time, or other interferences corrupting the sampling instants.

The data processing system can process the electrical data from the trigger window. The data processing system can determine the absolute magnitude, the average, and/or the difference of the electrical data from the trigger windows. For example, according to the absolute magnitude of the electrical data, the data processing system can take action (e.g., perform one or more operations) to mitigate or prevent damage to the electrical component of the circuit, such as when a current magnitude is above at least one threshold. In another example, according to a pattern (behavior) in the electrical difference, such as a difference between a first average value of data obtained from a first sensor and a second average value of data obtained from a second sensor, the data processing system can detect a fault current and a fault location. The data processing system can perform a predetermined action to isolate the fault, reconfigure or update the control settings, and/or take other remedial actions. Therefore, the systems and methods of the technical solution can provide features or techniques for fault detection, isolation (e.g., localization), prevention, diagnosing the fault, avoiding, mitigating or preventing damage to electrical components, or providing an indication of the circuit or system condition.

At least one aspect of the present disclosure is directed to a system. The system can include a data processing system comprising one or more processors and a memory. The data processing system can receive first electrical data obtained from a first sensor positioned at a first terminal of a power source. The data processing system can receive second electrical data obtained from a second sensor positioned at a second terminal of the power source. The data processing system can determine a first average value from the first electrical data and a second average from the second electrical data. The data processing system can determine a difference between the first average value and the second average value. The data processing system can detect a fault impedance according to a pattern of the difference between the first average value and the second average value over a measured time interval. Responsive to detecting the fault impedance, the data processing system can provide, via a graphical user interface (GUI), an indication of the fault impedance.

In some implementations, first sensor and the second sensor can be current sensors. The first electrical data and the second electrical data can be current data. The data processing system can, responsive to detecting the fault impedance, provide the indication of the fault impedance via a Controller Area Network (CAN) to initiate a recovery action. In some implementations, the first average value and the second average value can be associated with at least one trigger window. In some implementations, responsive to detecting the fault impedance, the data processing system can send, to at least one gate driver associated with at least one respective transistor, a command to adjust electrical power to an electromechanical actuator. The electromechanical actuator can be electrically coupled to the power source via the at least one respective transistor.

In some implementations, to detect the fault impedance, the data processing system can increment a counter responsive to the difference being greater than or equal to an upper threshold or less than or equal to a lower threshold. The data processing system can detect the fault impedance responsive to the counter being greater than or equal to a count threshold.

In some implementations, to detect the fault impedance, the data processing system can detect a location of the fault impedance according to the pattern of the difference between the first average value and the second average value over the measured time interval. In some implementations, the data processing system can detect a first location of the fault impedance responsive to the difference being lower than or equal to a lower threshold for a predetermined number of consecutive cycles.

In some implementations, the data processing system can detect a second location of the fault impedance responsive to a modulation of the difference between being lower than or equal to a lower threshold and zero for a predetermined number of cycles. In some implementations, the data processing system can detect a third location of the fault impedance responsive to the difference being greater than or equal to an upper threshold for a predetermined number of cycles.

In some implementations, the data processing system can determine a first maximum value from the first electrical data and a second maximum value from the second electrical data. The data processing system can detect a first fault responsive to the first maximum value or the second maximum value being greater than or equal to a predetermined first threshold. The data processing system can responsive to detecting the first fault, send, to at least one gate driver, a command to disable at least one transistor associated with the at least one gate driver.

In some implementations, the data processing system can determine a first maximum value from the first electrical data and a second maximum value from the second electrical data. The data processing system can detect a second fault responsive to the first maximum value or the second maximum value being greater than or equal to a predetermined second threshold, wherein the predetermined second threshold is lower than a predetermined first threshold. Responsive to detecting the second fault, the data processing system can send, to at least one gate driver associated with at least one respective transistor, a command to reduce electrical power for supply to an electromechanical actuator.

At least one aspect of the present disclosure is directed to a circuit. The circuit can include a power source. The circuit can include a first sensor positioned at a first terminal of the power source. The circuit can include a second sensor positioned at a second terminal of the power source. The circuit can include a data processing system comprising one or more processors and a memory. The data processing system can receive first electrical data which is derived from one or more measurements by the first sensor. The data processing system can receive second electrical data which is derived from one or more measurements by the second sensor. The data processing system can determine a first average value from the first electrical data and a second average value from the second electrical data. The data processing system can determine a difference between the first average value and the second average value. The data processing system can detect a fault impedance according to a pattern of the difference between the first average value and the second average value over a measured time interval. Responsive to detecting the fault impedance, the data processing system can provide, via a graphical user interface (GUI), an indication of the fault impedance.

In some implementations, the circuit can include at least one gate driver. The circuit can include at least one transistor associated with the at least one gate driver. The circuit can include an electromechanical actuator. Responsive to detecting the fault impedance, the data processing system can send, to the at least one gate driver, a command to adjust electrical power to the electromechanical actuator. The electromechanical actuator can be electrically coupled to the power source via the at least one respective transistor.

In some implementations, to detect the fault impedance, the data processing system can increment a counter responsive to the difference being greater than or equal to an upper threshold or less than or equal to a lower threshold. The data processing system can detect the fault impedance responsive to the counter being greater than or equal to a count threshold.

At least one aspect of the present disclosure is directed to a method. The method can include receiving, by a data processing system comprising one or more processors and a memory, first electrical data obtained from a first sensor positioned at a first terminal of a power source. The method can include receiving, by the data processing system, second electrical data obtained from a second sensor positioned at a second terminal of the power source. The method can include determining, by the data processing system, a first average value from the first electrical data and a second average value from the second electrical data. The method can include determining, by the data processing system, a difference between the first average value and the second average value. The method can include detecting, by the data processing system, a fault impedance according to a pattern of the difference between the first average value and the second average value over a measured time interval. The method can include, responsive to detecting the fault impedance, providing, by the data processing system, via a graphical user interface (GUI), an indication of the fault impedance.

In some implementations, detecting the fault impedance can include detecting, by the data processing system, a location of the fault impedance according to the pattern of the difference between the first average value and the second average value over the measured time interval. In some implementations, the method can include detecting, by the data processing system, a first location of the fault impedance responsive to the difference being lower than or equal to a lower threshold for a predetermined number of consecutive cycles.

In some implementations, the method can include detecting, by the data processing system, a second location of the fault impedance responsive to a modulation of the difference between being lower than or equal to a lower threshold and zero for a predetermined number of cycles. In some implementations, the method can include detecting, by the data processing system, a third location of the fault impedance responsive to the difference being greater than or equal to an upper threshold for a predetermined number of cycles.

In some implementations, the method can include determining, by the data processing system, a first maximum value from the first electrical data and a second maximum value from the second electrical data. The method can include detecting, by the data processing system, a first fault responsive to the first maximum value or the second maximum value being greater than or equal to a predetermined first threshold. The method can include responsive to detecting the first fault, sending, by the data processing system, to at least one gate driver, a command to disable at least one transistor associated with the at least one gate driver.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

In the accompanying drawings, like reference numbers and designations in the various drawings indicate like elements. For purposes of clarity, not every component may be labeled in every drawing. In the drawings.

DETAILED DESCRIPTION

Figure 1:
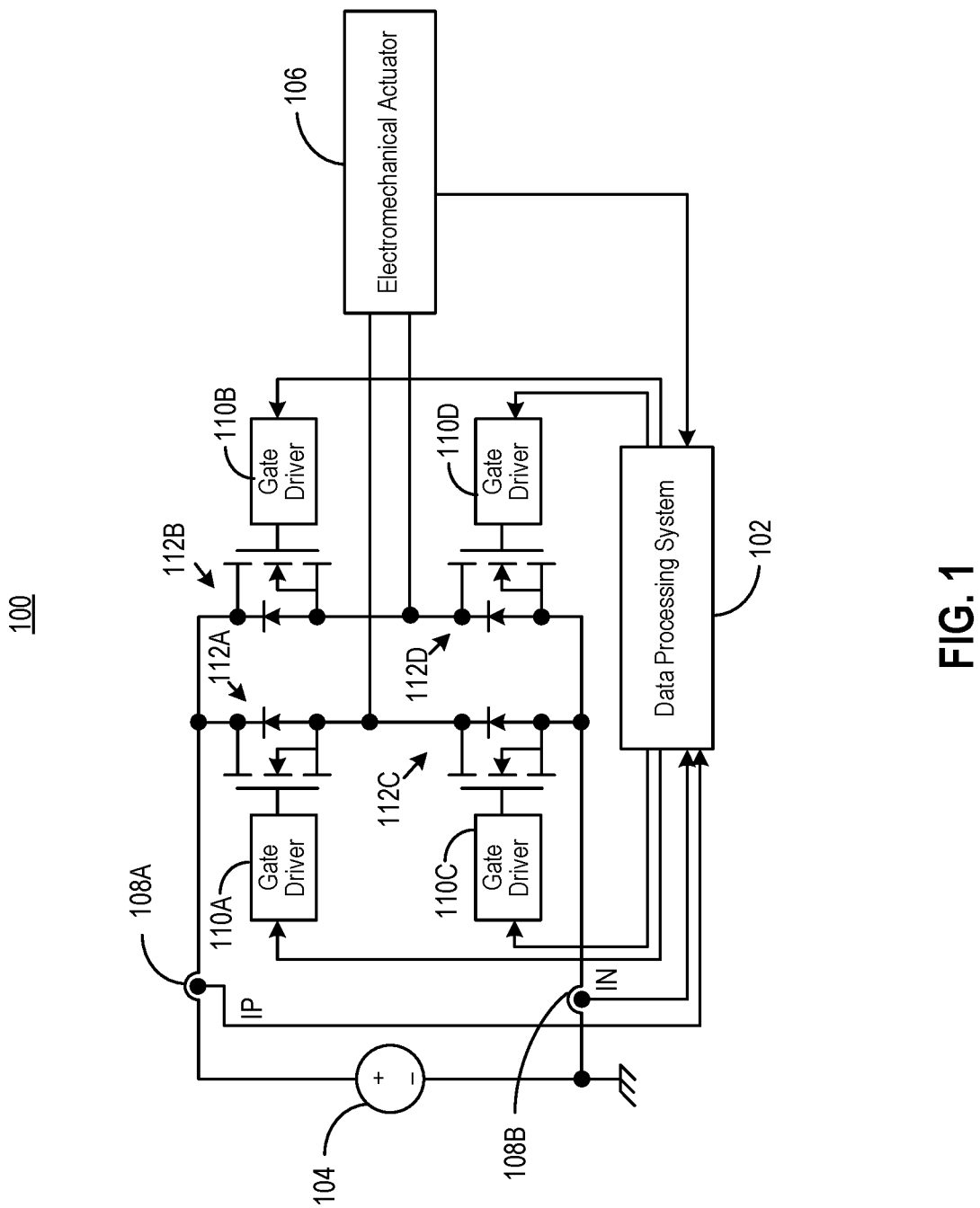
FIG. 1 depicts a block diagram depicting an example system for fault detection, diagnosis, and recovery in an electromechanical actuator, in accordance with an embodiment.

Below are detailed descriptions of various concepts related to, and implementations of, techniques, approaches, methods, apparatuses, and systems relating to the aspects summarized above. The various concepts introduced above and discussed in greater detail below may be implemented in any of numerous ways, as the described concepts are not limited to any particular manner of implementation. Examples of specific implementations and applications are provided primarily for illustrative purposes.

This technical solution is directed to systems and methods of fault detection, diagnosis, and recovery in EMA. For example, certain systems can be implemented with a two-level (or two-phase) power converter used for power conversion from a power source. The power converter can manage power supplied from the power source to one or more electrical components within the circuit, such as but not limited to the EMA. The two-level power converter may sometimes be referred to as an H-bridge, including multiple transistors (e.g., electronic switches) arranged relatively in an H-shape (or in a similar connection scheme). However, electrical irregularities (e.g., a potential fault) may occur within the circuit, for instance, at a location relative to the H-bridge. It may be difficult to detect a potential fault condition, such as but not limited to fault impedance, damaging the internal components over time. The systems and methods of the technical solution discussed herein can provide a data processing system (e.g., a microprocessor) to monitor electrical characteristics within the circuit to detect, diagnose, and recover from faults.

The systems and methods can include a device (e.g., the data processing system or the microprocessor) configured to perform a digital pulse width modulation (PWM) technique, such as using a center-aligned digital PWM carrier for the power converter circuit. Two sensors (e.g., current sensors or other electrical sensors) can be implemented including a first sensor positioned/placed in the power feed (e.g., positive power rail of a power source) and a second sensor positioned in the return feed (e.g., negative power rail of the power source). The current sensors can sense one or more electrical properties and provide electrical data to the data processing system. The signals from these sensors can be sampled simultaneously and converted to digital form by using, for instance, respective analog-to-digital converters (ADCs). The sampling of the ADCs can be synchronized with the peak and valley of the center-aligned PWM carrier. The data processing system can use any suitable sampling technique for sampling signals or information sensed by the sensors, including compatibility with at least successive approximation register (SAR) ADCs or delta-sigma modulated (DS) ADCs. The data processing system can adjust the width or position of a trigger window (e.g., time period or time window including a subset of electrical data) within the PWM carrier to account for different characteristics of the ADCs. In some cases, the data processing system can adjust the trigger window in real time depending on the operating conditions of the power converter (e.g., one or more transistors of the H-bridge) to obtain optimal sampling instants and extend the fault current detection capability. By adjusting the trigger window, the data processing system can account for nonidealities of the power converter, such as slew rates, inserted power device blanking time, or other interferences corrupting the sampling instants. The data processing system can adjust the trigger window as part of data filtering or data pre-processing.

The data processing system can (post-) process the electrical data from the trigger window. For example, the data processing system can determine the absolute magnitude, the average, and/or the difference of the electrical data from the trigger windows. The data processing system can take action (e.g., perform one or more operations) in response to an objectionable magnitude to mitigate or prevent damage to the electrical component of the circuit, such as when a current magnitude is above at least one threshold. In some cases, the data processing system can detect a fault current and a fault location according to a pattern in the electrical difference, such as a difference between a first average of a property measured from a first sensor and a second average of a property measured by a second sensor. Upon identifying any of the fault types, the data processing system can perform a predetermined action to isolate the fault, reconfigure or update the control settings, and/or take other remedial actions. Therefore, the systems and methods of the technical solution can provide features or techniques for fault detection, isolation (e.g., localization), prevention, diagnosing the fault, avoiding, mitigating or preventing damage to electrical components, or providing an indication of the circuit or system condition.

FIG. 1 depicts a block diagram depicting an example system 100 (or circuit) for fault detection, diagnosis, and recovery in an electromechanical actuator. The system 100 can include but is not limited to at least one data processing system 102, at least one power source 104, at least one electromechanical actuator (EMA) 106, a plurality of sensors 108A-B (e.g., sometimes referred to as sensor(s) 108), a plurality of gate drivers 110A-D (e.g., sometimes referred to as gate driver(s) 110), and a plurality of transistors 112A-D (e.g., sometimes referred to as transistor(s) 112). These elements can be referred to generally as one or more components of the system 100. The system 100 can utilize the features and functionalities of one or more components to perform fault detection, diagnosis, recovery, etc. The one or more components (e.g., power source 104, EMA 106, sensors 108, gate drivers 110, or transistors 112) can be in (e.g., electrical) communication with the data processing system 102. For example, the one or more components (e.g., power source 104, EMA 106, sensors 108, gate drivers 110, or transistors 112) can send or receive signals or information to/from the data processing system 102. The communication between the components can be via wire or wireless communication. The data processing system 102 can include, be a part of, or be referred to as a microprocessor, a computing device, or a data management component, for example. It should be appreciated that to the extent that any structures, devices, or systems of the present disclosure are described as having a processor, such a processor can include one or more processors individually or collectively configured to carry out a plurality of the operations disclosed herein.

Each of the above-mentioned elements or entities can be implemented in hardware, or a combination of hardware and software, in one or more embodiments. Each component of the system 100 may be implemented using hardware or a combination of hardware or software. For instance, each of these elements or entities can include any application, program, library, script, task, service, process, or any type and form of executable instructions executing on hardware of a device. The hardware includes circuitry such as one or more processors in one or more embodiments. In some cases, the system 100 can correspond to a circuit including circuit components described herein.

The power source 104 can include, be a part, or be referred to as a power supply, a battery, a power station, a generator, or a utility grid. The power source 104 can include a first terminal and a second terminal. The first terminal may refer to the positive terminal, rail, or contact of the power source 104. The second terminal may refer to the negative terminal, rail, or contact of the power source 104. As shown, the first terminal can be connected (e.g., directly) to the terminals of the transistors 112A-B. The second terminal can be connected (e.g., directly) to the terminals of the transistors 112C-D. The second terminal can be connected to the ground. The power source 104 can be a direct current (DC) power source. In some cases, the power source 104 may be an alternating current (AC) power source. The power source 104 can supply/provide power to one or more components of the system 100, such as at least one of but not limited to the EMA 106 via the one or more transistors 112 (e.g., the multi-phase power converter), the sensors 108, the one or more gate drivers 110, or the data processing system 102.

The EMA 106 can be configured to convert electrical energy into mechanical motion or force, such as a throttle body of a vehicle to provide an example. For example, the EMA 106 can receive electrical power from the power source 104 via the one or more transistors 112 (e.g., the multi-phase power converter controlled by the data processing system 102). The EMA 106 can convert the received power to generate a mechanical force, such as a rotational force, thrust force, linear actuation force, etc. In some cases, the EMA 106 can generate the mechanical force bidirectionally. For instance, the EMA 106 can generate a rotational force in a clockwise direction or a counter-clockwise direction according to the configuration of the multi-phase power converter. The EMA 106 can include at least one sensor to measure or estimate one or more physical quantities that are being controlled or regulated by the system 100. The physical quantities may include but are not limited to at least one of angular position, linear position, velocity, acceleration, torque, linear force, flow rate, temperature, voltage, current, electrical power, or mechanical power. The EMA 106 can send signals to the data processing system 102. The signals can include or indicate the operation, status, the physical quantities, or other information associated with the EMA 106. For example, the EMA 106 may send feedback information regarding its received power (e.g., current draw), the position of the actuator, operating time, temperature, error codes or internal fault alerts, health status (e.g., from internal sensors of the EMA 106), etc. It should be noted that the EMA 106 is provided as an example component of the system 100, and other (e.g., electrical) components can be implemented additionally or alternatively to the EMA 106, such as other types of motors, blowers, heating elements, pumps, or other mechanical components.

The sensors 108 can sense or capture electrical information portions of the system 100. The sensors 108 can include but are not limited to current sensors. In some implementations, other types of sensors can be used in the system 100, such as voltage sensors, magnetic sensors, humidity sensors, motion sensors, etc. For simplicity and for purposes of providing examples herein, the sensors 108 can refer to current sensors configured to sense or measure current flow at respective portions of the system 100. As shown, the sensors 108 can be positioned relative to the power source 104. For example, a first sensor (e.g., sensor 108A) can be positioned or implemented at or around the first terminal (e.g., positive terminal) of the power source 104. A second sensor (e.g., sensor 108B) can be positioned at or around the second terminal (e.g., negative terminal or ground) of the power source 104. According to the position of the sensors 108, the first sensor can log current data relative to the power feed and the second sensor can log current data relative to the return feed of the power source 104. The sensors 108 can send signals to the data processing system 102 including the sensed current data. The signals can include timestamps of the sensed current data. The sensors 108 may be synced. The sensors 108 can capture current information simultaneously or in relatively similar time instances.

The gate drivers 110 can be integrated circuits (ICs) configured to interface with the data processing system 102 and the transistors 112 of the system 100. The gate drivers 110 can be coupled to gates of the respective transistors 112, such as shown in conjunction with at least FIG. 1. The gate drivers 110 can include one or more features to allow the data processing system 102 (e.g., microcontroller) to control or operate the transistors 112 (e.g., the multi-phase power converter). For example, the gate drivers 110 can provide signal amplification, signal isolation, or dead time generation, to name a few. For instance, the gate drivers 110 can receive control signals from the data processing system 102. The gate drivers 110 can amplify the signal from the data processing system 102 to provide desired (e.g., predetermined) voltage and/or current levels to drive the gate of the transistors, thereby switching the state of the transistor from "OFF" to "ON". The gate drivers 110 may adjust the amplification (e.g., power level) based on the signals from the data processing system 102. In some cases, the gate drivers 110 can provide electrical isolation between the control circuitry and the power stage. In some other cases, the gate drivers 110 may incorporate dead time generation circuitry to prevent shoot-through current. For purposes of providing examples herein, the gate drivers 110 can be configured to operate the transistors 112 according to commands or signals from the data processing system 102.

The transistors 112 can include, correspond to, or be referred to as power transistors, metal-oxide-semiconductor field-effect transistors (MOSFETs), or insulated-gate bipolar transistors (IGBTs), among other types of transistors capable of providing the features of a two-phase power converter. The transistors 112 can form a multi-phase power converter, such as but not limited to a two-phase (e.g., level) power converter. It should be noted that the four transistors 112 are provided for purposes of forming the example two-phase power converter, although more or less transistors can be implemented to form other types of multi-phase power converter (e.g., three-phase, four-phase, etc.), not limited to the two-phase power converter. The multi-phase power converter can be configured to control the direction of the current flow through a load (e.g., EMA 106).

For example, as shown in at least FIG. 1, the system 100 can include high-side (HS) transistors and low-side (LS) transistors. The HS transistors can refer to the transistors with their drains connected to the power feed (e.g., the positive terminal of the power source 104), such as transistors 112A-B. For instance, the transistor 112A may be referred to as a first HS transistor (e.g., HS1) and the transistor 112B may be referred to as a second HS transistor (e.g., HS2). The LS transistors can refer to the transistors with their sources connected to the ground or the return feed, such as transistors 112C-D. For instance, the transistor 112C may be referred to as a first LS transistor (e.g., LS1) and the transistor 112D may be referred to as a second LS transistor (e.g., LS2).

As shown, for example, HS1 and LS1 can be in a series connection, and HS2 and LS2 can be in another series connection. For example, the source of the HS1 can be in (e.g., electrical) connection with the drain of the LS1. In another example, the source of the HS2 can be in (e.g., electrical) connection with the drain of the LS2. The HS1 and LS1 can be referred to as a first set of transistors associated with a first side of the H-bridge. The HS2 and LS2 can be referred to as a second set of transistors associated with a second side of the H-bridge. The first set of transistors can be connected in parallel to the second set of transistors. Each of the transistors 112 can be in electrical communication with a respective gate driver 110. The transistors 112 can be controlled by the gate drivers 110 according to signals from the data processing system 102.

The terminals of the EMA 106 (or other loads) can be connected to respective sides of the H-bridge. For example, a first terminal of the EMA 106 can be connected between the HS1 and LS1, e.g., the source of the HS1 or the drain of the LS1. In another example, a second terminal of the EMA 106 can be connected between the HS2 and the LS2, e.g., the source of the HS2 or the drain of the LS2. In various configurations, turning on the HS1 or HS2 can allow either the first terminal or the second terminal of the EMA 106 to be connected to the power feed (e.g., allowing current flow from supply to load). Turning on the LS1 or LS2 can complete the circuit, thereby allowing current to flow from load to ground. Depending on the states (e.g., ON or OFF states) of individual transistors 112, controlled by the data processing system 102 via the gate drivers 110, the data processing system 102 can manage the direction and magnitude of current through the load (e.g., the EMA 106), as discussed herein. In various configurations, the arrangements of the transistors 112 can allow for DC-to-DC power conversion or DC-to-AC power conversion (for DC power source). In such configurations, the data processing system 102 can be configured to control or manage the overall power conversion process to provide electrical power/energy to the EMA 106, for instance, to achieve a desired actuation trajectory or setpoint, for example.

The system 100 can include at least one data processing system 102 for fault detection, diagnosis, and recovery. The data processing system 102 can include at least one processor and a memory, e.g., a processing circuit. The memory can store processor-executable instructions that, when executed by the processor, cause the processor to perform one or more of the operations described herein. The processor may include a microprocessor, an application-specific integrated circuit (ASIC), a field-programmable gate array (FPGA), etc., or combinations thereof. The memory may include, but is not limited to, electronic, optical, magnetic, or any other storage or transmission device capable of providing the processor with program instructions. The memory may further include a floppy disk, CD-ROM, DVD, magnetic disk, memory chip, ASIC, FPGA, read-only memory (ROM), random-access memory (RAM), electrically erasable programmable ROM (EEPROM), erasable programmable ROM (EPROM), flash memory, optical media, or any other suitable memory from which the processor can read instructions. The instructions may include code from any suitable computer programming language. The data processing system 102 can include one or more computing devices or servers that can perform various functions as described herein. The data processing system 102 can include one or more components configured to execute the features or operations discussed herein.

In some configurations, the data processing system 102 can be embedded as part of the system 100 (or circuit). In some configurations, the data processing system 102 can be a device or a component external to the one or more components (e.g., the power source 104, EMA 106, sensors 108, gate drivers 110, or transistors 112) of the system 100. The data processing system 102 can communicate with the one or more components of the system 100 via wired or wireless communication. In some implementations, the data processing system 102 can include a display device to provide a graphical user interface (GUI) to a user or an administrator of the system 100 (or the data processing system 102). In some cases, the data processing system 102 can be in communication with an external display device to provide the GUI to the user. In some arrangements, the data processing system 102 can communicate with one or more other computing devices, for instance, to forward or share information or delegate certain processing operations.

The data processing system 102 can receive or obtain data/information from the sensors 108. The data can include electrical data, such as but not limited to current data at or proximate to the power feed and the return feed of the power source 104. The data processing system 102 can process the sensor data to detect, diagnose, or perform recovery actions from faults. For example, in certain environments, the one or more transistors 112 of the power converter (e.g., H-bridge) or the EMA 106 may potentially be exposed to at least one electrical fault condition. One such fault condition may be caused by failures in wire harnesses and electrical connector subsystems. Another fault condition may be caused by a failing power converter component (e.g., failure of at least one transistor 112). The effect on the circuit caused by the fault may vary depending on the type of fault. For instance, the effect of an electrical fault can include the inability to perform power conversion, performance variation (e.g., instability of power conversion or current flow) within the system 100, or degradation of or damage to the EMA 106. The degradation of the EMA 106 caused by a certain type of fault may lead to failure in tracking commands from the data processing system 102, such as variations or instability of current flow to the EMA 106. Examples of different types of faults or the location of the faults can be described in conjunction with at least FIGS. 2A-F.

FIGS. 2A-F show block diagrams 200A-F depicting potential fault locations (or different types of electrical fault conditions), for example, on the example system of FIG. 1, in accordance with an embodiment. As shown, the electrical fault impedance can be labeled as "ZFLT". The fault impedance may have any ranging values, such as from sub-milli-ohm to tens of ohms, for example. In some cases, certain fault impedances may cause EMA abnormalities, such as at least one of the fault impedances shown in but not limited to FIGS. 2A-F. In such cases, the systems and methods of the technical solution (e.g., utilizing the data processing system 102) can detect and remedy these fault conditions before potential damage occurs to the EMA 106 or other components of the system 100.

Figure 2A:
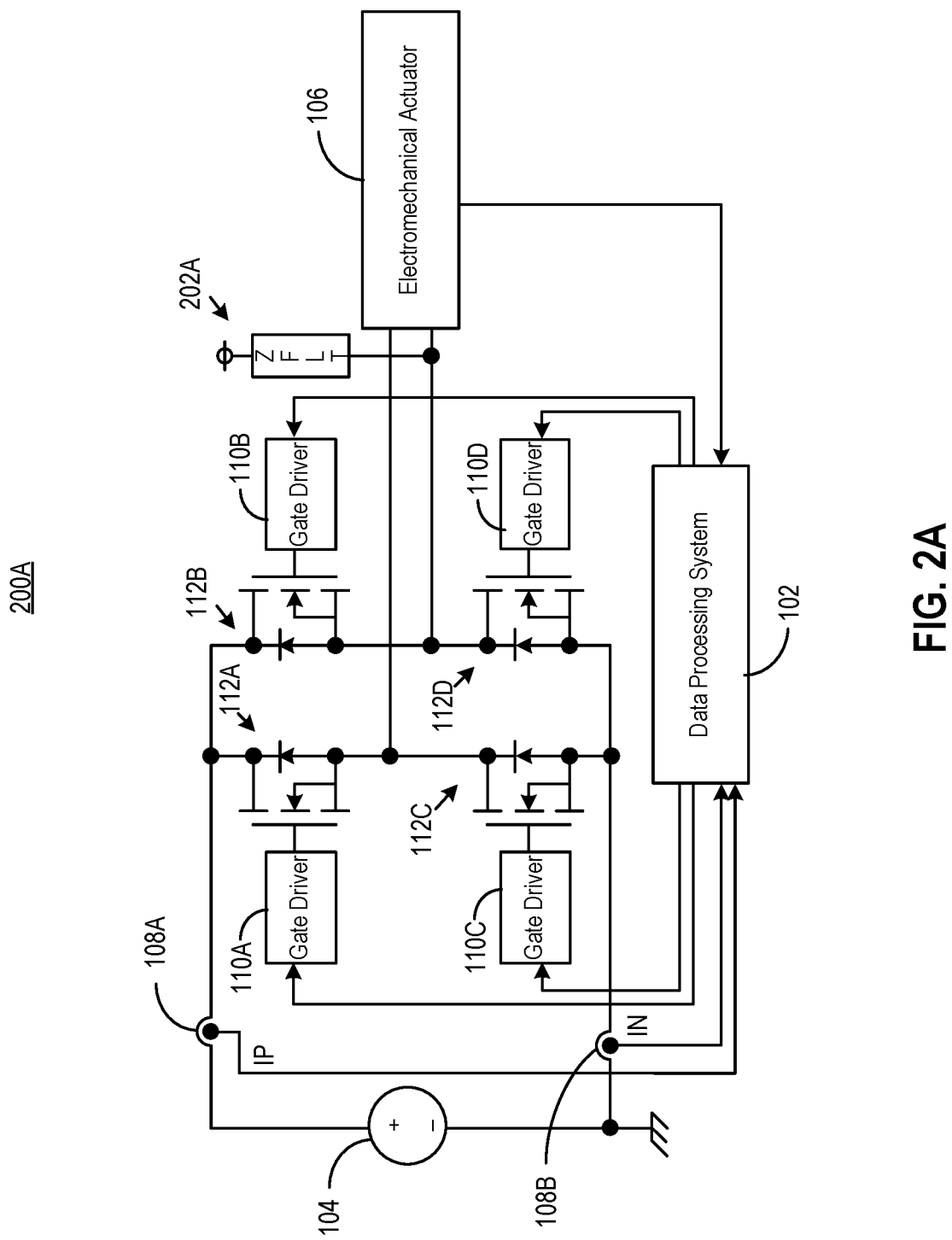
FIGS. 2A-F depict block diagrams depicting potential fault locations, for example, on the example system of FIG. 1, in accordance with an embodiment.
Figure 2B:
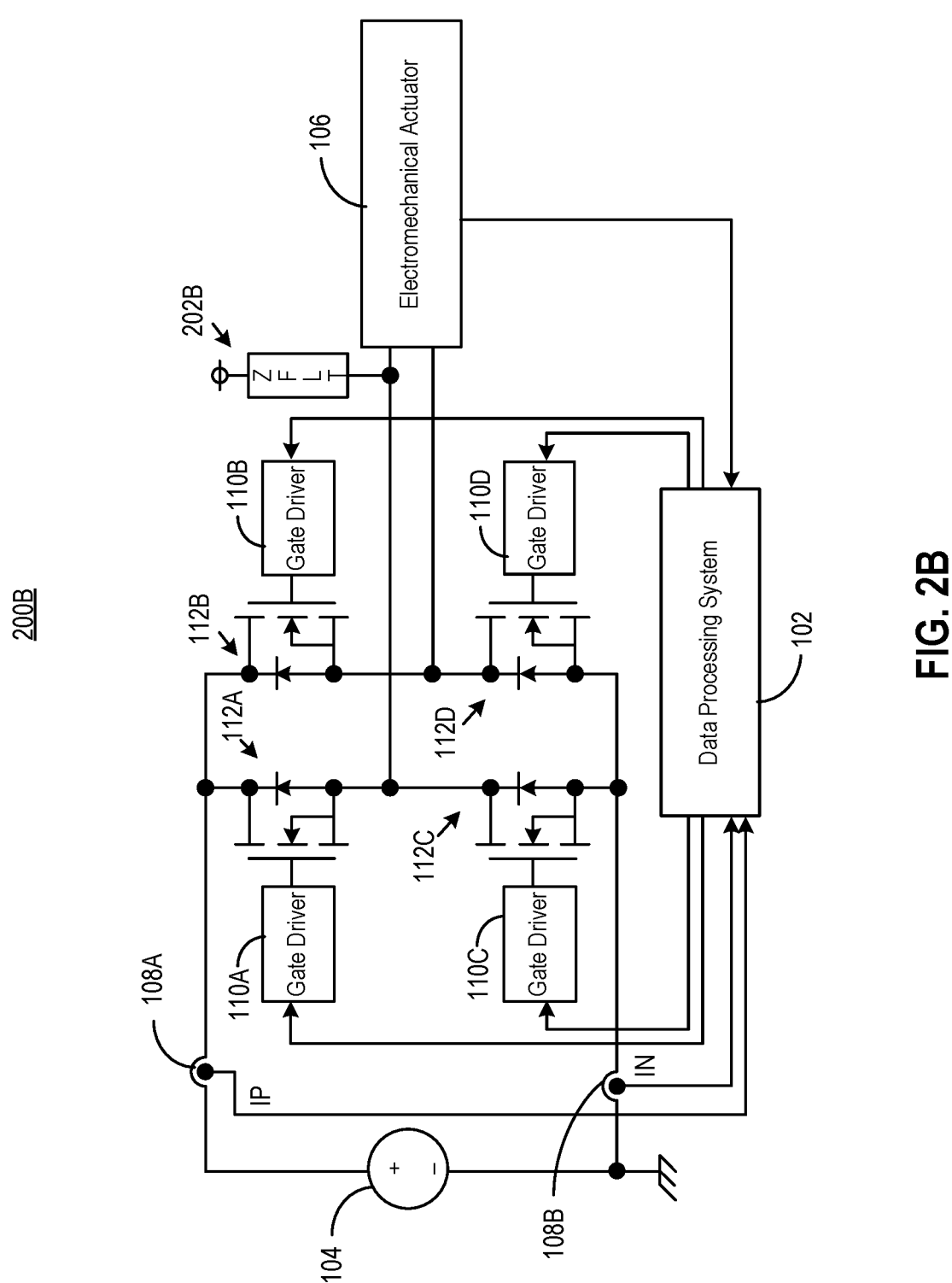

For example, FIG. 2A shows a potential fault impedance 202A between the source and drain of the transistor 112B (or from the second terminal of the EMA 106 to the power feed). For purposes of providing examples herein, the potential fault impedance 202A can be referred to as a type 2 impedance fault (e.g., "Flt2"). The Flt2 may be associated with the upper right (UR) portion of the H-bridge, for example. FIG. 2B shows a potential fault impedance 202B between the source and drain of the transistor 112A (or from the first terminal of the EMA 106 to the power feed). For purposes of providing examples herein, the potential fault impedance 202B can be referred to as a type 3 impedance fault (e.g., "Flt3"). The Flt3 may be associated with the upper left (UL) portion of the H-bridge, for example.

Figure 2C:
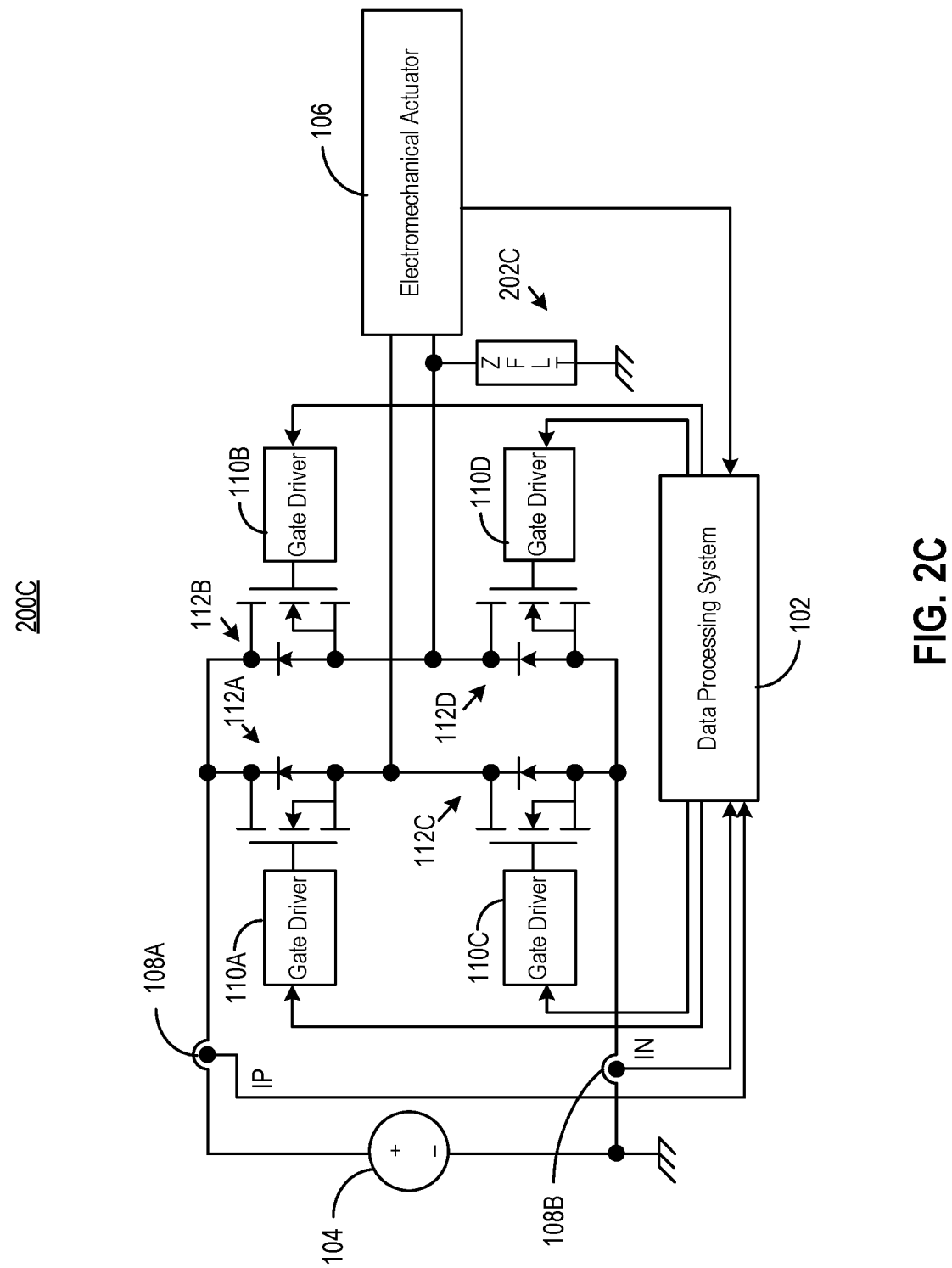
Figure 2D:
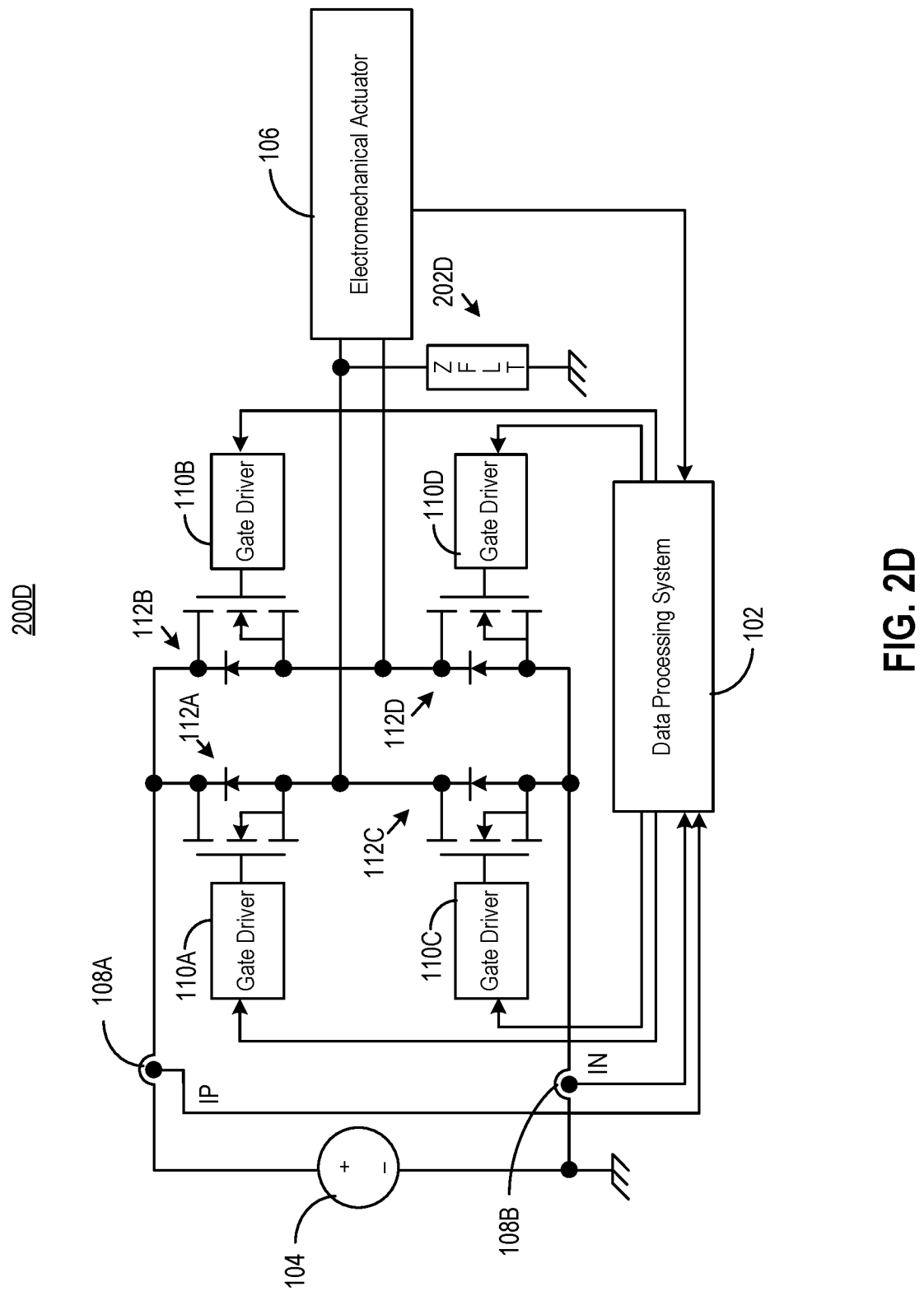

FIG. 2C shows a potential fault impedance 202C between the source and drain of the transistor 112D (or from the second terminal of the EMA 106 to the return feed or ground). For purposes of providing examples herein, the potential fault impedance 202C can be referred to as a type 1 impedance fault (e.g., "Flt1"). The Flt1 may be associated with the lower right (LR) portion of the H-bridge, for example. FIG. 2D shows a potential fault impedance 202D between the source and drain of the transistor 112C (or from the first terminal of the EMA 106 to the return feed or ground). For purposes of providing examples herein, the potential fault impedance 202B can be referred to as a type 4 impedance fault (e.g., "Flt4"). The Flt4 may be associated with the lower left (LL) portion of the H-bridge, for example.

Figure 2E:
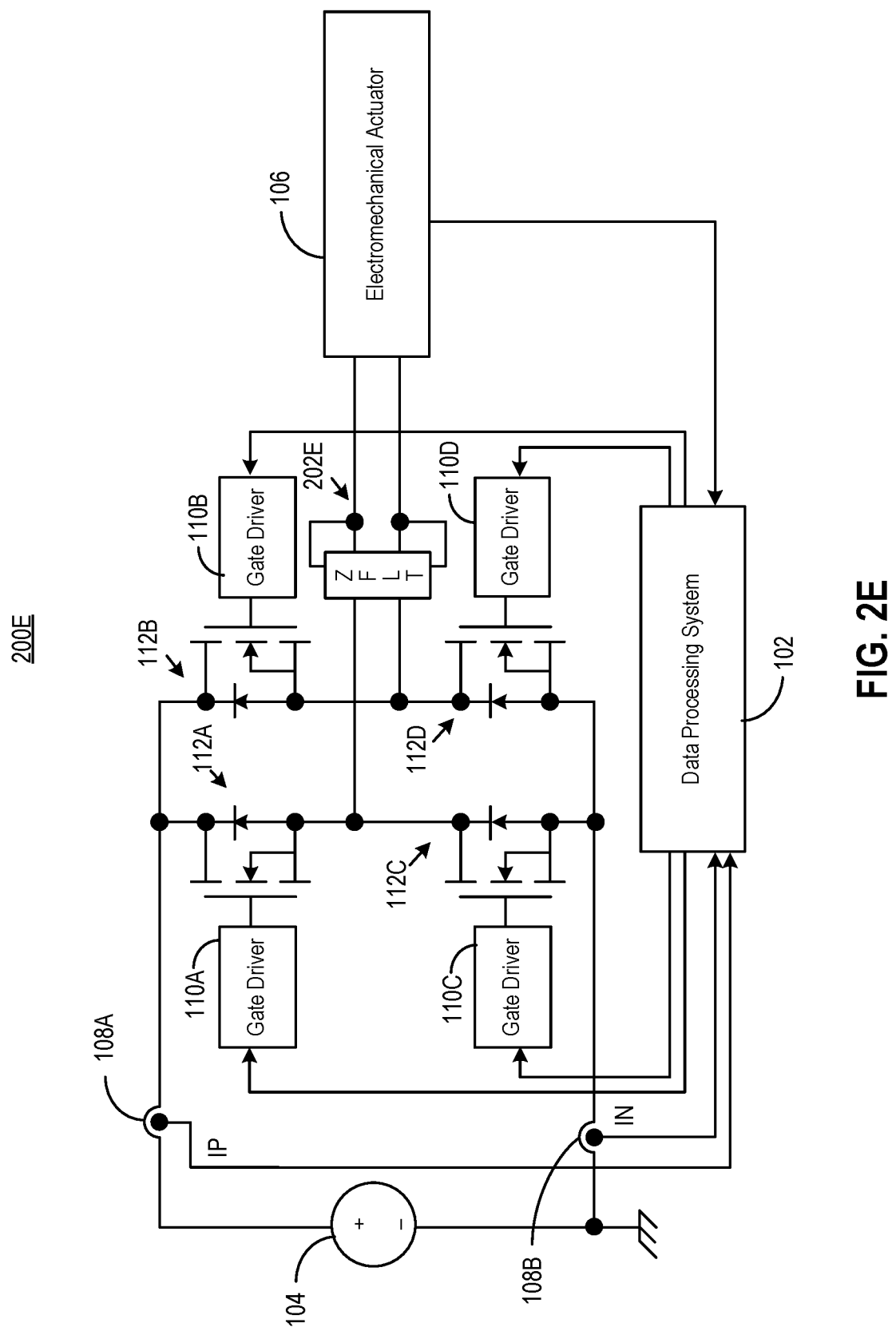
Figure 2F:
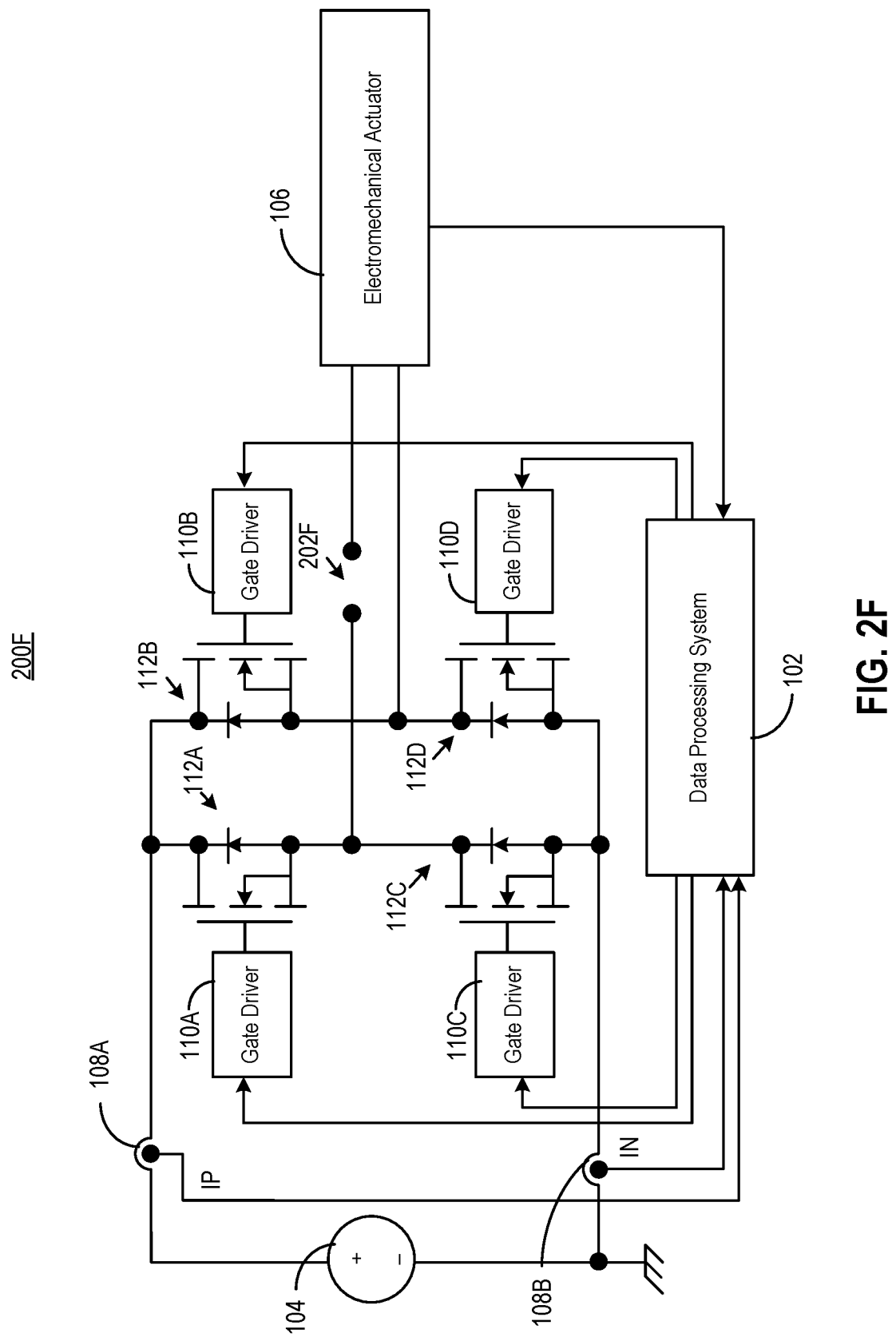

Other types of fault, not limited to those described in conjunction with FIGS. 2A-D, may potentially occur within certain systems, which may be detected, diagnosed, or recovered using features or operations discussed herein. Although, for purposes of providing examples, the data processing system 102 can process data from the one or more components of the system 100 to detect, diagnose, and recover from at least the fault conditions of at least one of FIGS. 2A-D. For example, other types of faults can be shown in at least FIGS. 2E-F. FIG. 2E shows a potential fault impedance 202E between the first terminal and the second terminal. FIG. 2F shows a potential fault 202F including a disconnection of the first terminal of the EMA 106 from the source of the transistor 112A and the drain of transistor 112C.

Figure 3:
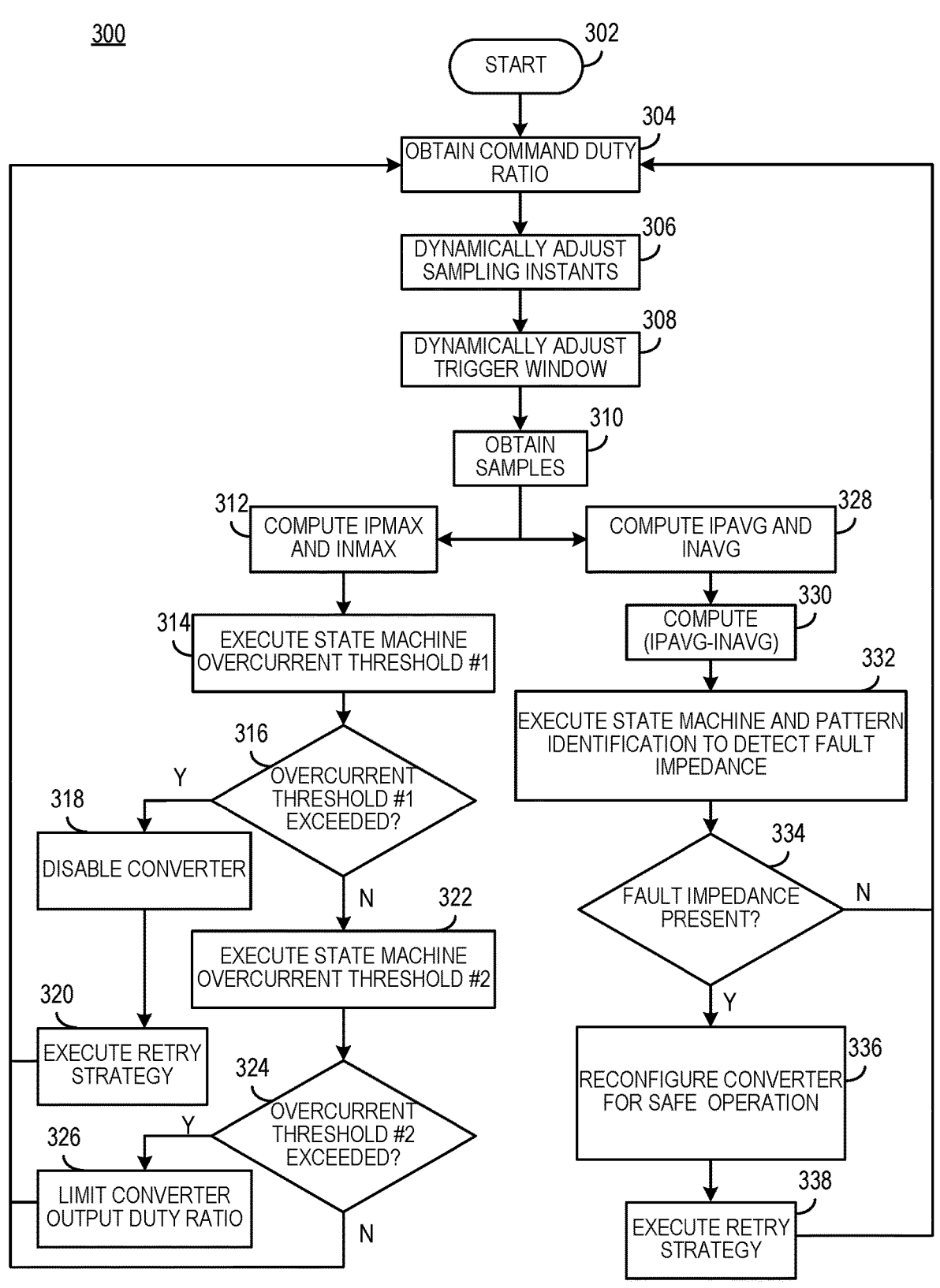
FIG. 3 depicts a flow diagram of an example method for detecting the fault location and responding to the fault, in accordance with an embodiment.

FIG. 3 depicts a flow diagram of an example method 300 for detecting the fault location and responding to the fault, in accordance with an embodiment. In various arrangements, the operations or functionality of the data processing system 102 can be described in conjunction with, but not limited to the example method 300 of FIG. 3. In some cases, one or more operations of the example method 300 may be performed by other components of the system 100 or other computing device. The example method 300 can start at 302, such as when the system 100 is in operation (e.g., starting the operation of the EMA 106). In some cases, the example method 300 can start when the EMA 106 is off (not in operation).

In conjunction with operation 304, the data processing system 102 can obtain a command duty ratio (e.g., associated with triangle wave carrier 402). At operation 306, the data processing system 102 can dynamically adjust the sampling instants (e.g., associated with PWM waveform 404). The dynamic criteria for adjusting the sampling instants can include but are not limited to at least one of the slew rates of the H-bridge power devices, the H-bridge dead-time, etc. The slew rates of the H-Bridge power devices may be measured in volts per second. The slew rates can change during the operation of the H-bridge power devices. For instance, responsive to slower slew rates (e.g., due to an increase in temperature, among other variables), the sampling instants can be delayed and moved to the right of the ideal peak and valley sampling instants. If the temperature is measured in the data processing system 102 (e.g., microcontroller), the data processing system 102 may adjust the sampling instants according to (e.g., to match) the changing slew rates, for example. In some cases, the slew rates can be adjusted during operation by sending appropriate signals or commands to at least one of the gate driver 112 of the H-bridge. Updating/changing the sampling instants according to the slew rates can extend the operating range of the power conversion. For example, if the temperature is approaching the maximum operating limits, the slew rates can be increased and the power devices can switch faster, thereby reducing switching power losses.

The dead-time can refer to when both power devices of the H-bridge are off. The dead-time can change during operation. For example, if the dead-time increases, the sampling instants may be delayed and moved to the right of the ideal peak and valley sampling instants. The dead-time may be associated with the power device slew rates. The dead-time can be provided/inserted by the data processing system 102 (e.g., microcontroller) pulse width modulated (PWM) commands. In some cases, the dead-time can be a one-time setting (e.g., preconfigured setting/configuration). In some other cases, for instance, if the microcontroller can increase the slew rates, then the dead-time can be reduced to extend the linear operating range of the power device duty cycle. Other criteria can be considered for adjusting the sampling instants, not limited to those discussed herein.

Figure 4:
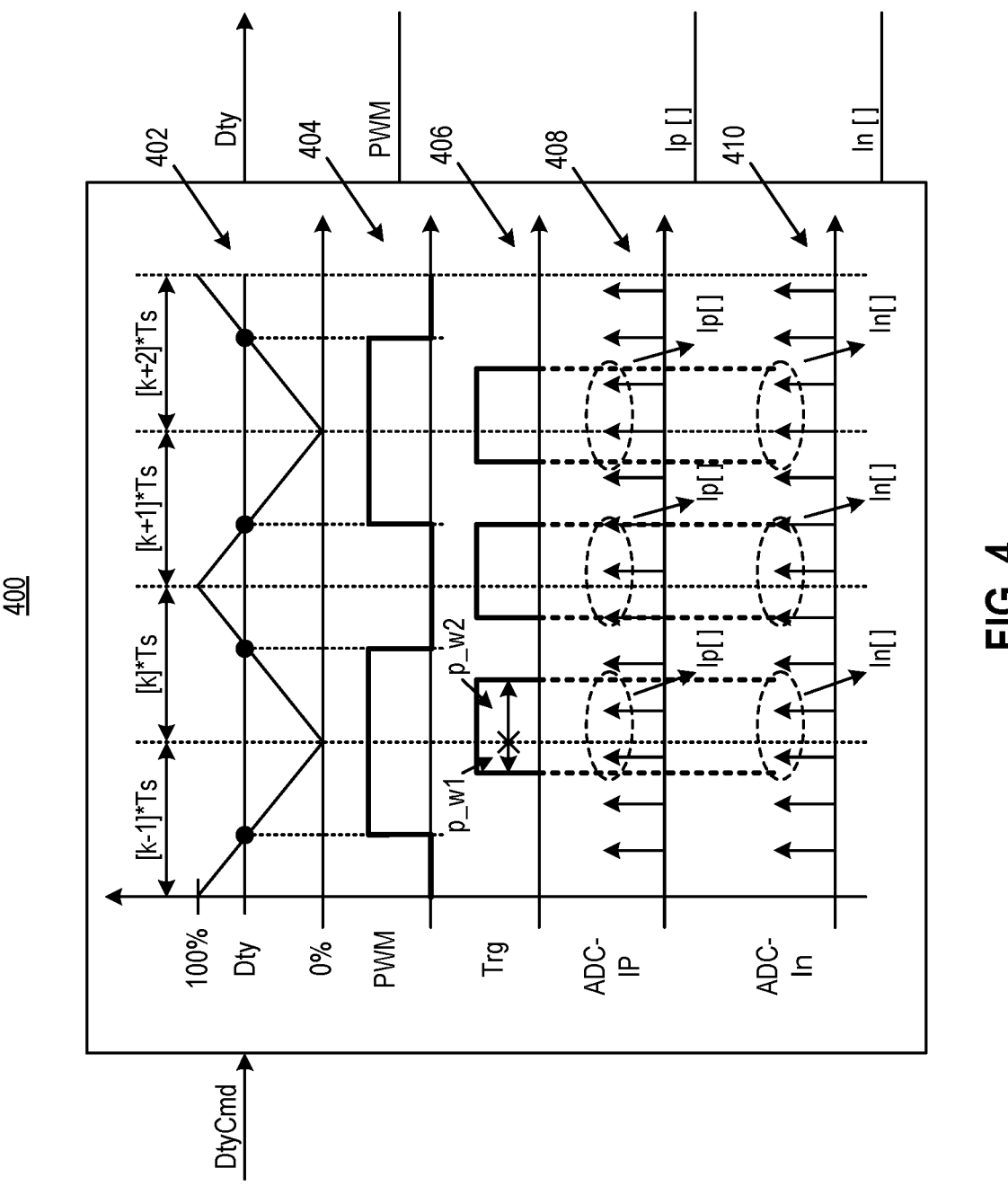
FIG. 4 depicts a waveform diagram for sampling electrical data, in accordance with an embodiment.

In some implementations, the operations 304-306 for obtaining the command duty ratio and adjusting the sampling instants can be described in conjunction with at least FIG. 4. For example, FIG. 4 shows a waveform diagram for sampling electrical data, in accordance with an embodiment. As shown, the data processing system 102 can obtain or generate a PWM waveform 404 by comparing a setpoint value against a triangle wave carrier 402. The triangle wave carrier 402 can be a reference signal predefined for PWM modulation. The duty ratio of the PWM waveform 404 can be described as an on-time divided by a total period. In some cases, the setpoint value shown in the triangle wave carrier 402 can be a predetermined setpoint value. In some cases, the setpoint value can be configured based on the desired or target power level (e.g., voltage or current level) for the EMA 106. The target power level can include a value, such as a percentage of the maximum allowable power configured for the EMA 106 or an amount of current or voltage to supply for the EMA 106.

As shown in FIG. 4, the triangle wave carrier 402 (e.g., sometimes referred to as a carrier waveform) can include symmetrical rising and falling slopes creating a condition where the active state of the duty ratio is center aligned within the carrier 402. For example, a center-aligned PWM can create a duty ratio that is around the center of the peak and valley of the triangle wave carrier 402 (e.g., equally straddling the peak and valley). The peak and valley of the triangle wave carrier 402 can create markers to allow other timing events to occur, which can affect the modulation of the PWM waveform 404 (e.g., sampling instants). An example of the timing event can include the sampling and subsequent conversion of analog signals by analog to digital converters (ADCs). Another example of the timing event can include the initiation of data processing system 102 (e.g., the microprocessor) operating system tasks. For instance, operating system tasks can include process inputs, execute control logic, or generate outputs, to name a few.

The modulation of the PWM waveform 404 can include or be associated with sampling instants for the data processing system 102. For example, the high signal (e.g., '1') of the PWM waveform 404, the low signal (e.g., '0') of the PWM waveform 404, or both the high signal and the low signal can be the time duration for executing timing events, such as for the data processing system 102 to sample data or execute the ADC (e.g., to obtain electrical data from the sensors 108). The data processing system 102 can adjust the modulation of the PWM waveform 404, for example, by changing the duty ratio (e.g., power level), increasing the peak or valley point of the triangle wave carrier 402, or decreasing the peak or valley point of the triangle wave carrier 402. The data processing system 102 can perform other operations to configure the modulation of the PWM waveform 404. It should be noted that the PWM generation and sampling strategy described in conjunction with at least FIG. 4 is provided as an example, and other non-limiting sampling strategies can be applied herein.

At operation 308, the data processing system 102 can dynamically adjust the trigger window 406. The trigger window 406 can include or be referred to as a time interval, time window, or portion of the PWM waveform 404 during which the data processing system 102 obtains the electrical data for processing. Each trigger window 406 can be associated with a portion of the PWM waveform 404, such as portions of the high signal or the low signal as shown in FIG. 4. For example, the ADC (e.g., successive approximation register (SAR), delta-sigma modulated (DS), or other types of ADCs) can be configured to convert the analog signals from the sensors 108 to digital signals for the data processing system 102. The ADC can be triggered during the trigger windows 406 to sample and perform the conversion, which can be synchronized with the peak and valley markers of the carrier waveform (e.g., triangle wave carrier 402). In some cases, the sampling instants and/or the trigger window 406 can be predetermined or configured by the administrator. In some other cases, as discussed herein, the sampling instants and/or the trigger window 406 can be dynamically adjusted according to the type of ADCs, the balance of control and power conversion, etc.

At operation 310, the data processing system 102 can obtain samples of the electrical data from the sensors 108 (or data converted by the ADCs). As shown, the data processing system 102 can obtain relevant data from the ADC during the trigger windows 406, which can be adjustable according to the PWM waveform 404 (e.g., on-time or off-time of the PWM duty cycle). The data from the ADC can include current data (or other types of electrical data) from at least the first sensor and the second sensor. These data obtained during the trigger windows can be referred to as samples (or sample data) for processing.

For example, as in FIG. 4, the current data (e.g., first electrical data) from the first sensor can be labeled as "ADC-IP" (408), where "IP" denotes the sensed current at the positive terminal of the power source 104. The current data (e.g., second electrical data) from the second sensor can be labeled as "ADC-In" (410), where "In" denotes the sensed current at the negative terminal (or ground) of the power source 104. In some aspects, the data processing system 102 can adjust the trigger window 406 depending on the type of ADC used for converting the signal information from the sensors 108. In some configurations, the data processing system 102 can be configured to adjust the trigger window 406 at predetermined portions of the PWM waveforms 404. In some cases, current data from each trigger window can be regarded as one sample. In some other cases, current data from each trigger window can include multiple samples.

The data processing system 102 can store the (sample) data obtained within the intervals of the trigger windows 406 in the memory (e.g., memory buffer or database). The data processing system 102 can process the samples of the current data, as described in conjunction with but not limited to operations 312-338, for fault detection, diagnosis, or recovery. In some arrangements, the operations 312-326 can be performed concurrent to the operations 328-338. In some arrangements, the operations 312-326 can be performed separately or independently from the operations 328-338.

At operation 312, the data processing system 102 can compute a maximum (e.g., absolute maximum) of the samples. For each sample (or a set of current data), the data processing system 102 can determine the (absolute) maximum or the highest value of the current data. For example, from the first electrical data (e.g., a first set of current data), the data processing system 102 can determine or obtain a first maximum value representing the highest current reading from the first sensor. From the second electrical data (e.g., a second set of current data), the data processing system 102 can obtain a second maximum value representing the highest current reading from the second sensor. The first maximum value and the second maximum value can be labeled as "IpMax" and "InMax" respectively, as shown in at least FIG. 5.

At operation 314, the data processing system 102 can execute a state machine for a first overcurrent (OC) threshold. The state machine may be a component of the data processing system 102. In some cases, the state machine can be a model executable by the data processing system 102. In some cases, the state machine can refer to an operation or a feature of the data processing system 102. In this case, in response to the execution of the state machine, the data processing system 102 can compare the IpMax or the InMax to the predetermined first OC threshold. The operations of the state machine for the first OC threshold can be described in conjunction with at least FIG. 5.

Figure 5:
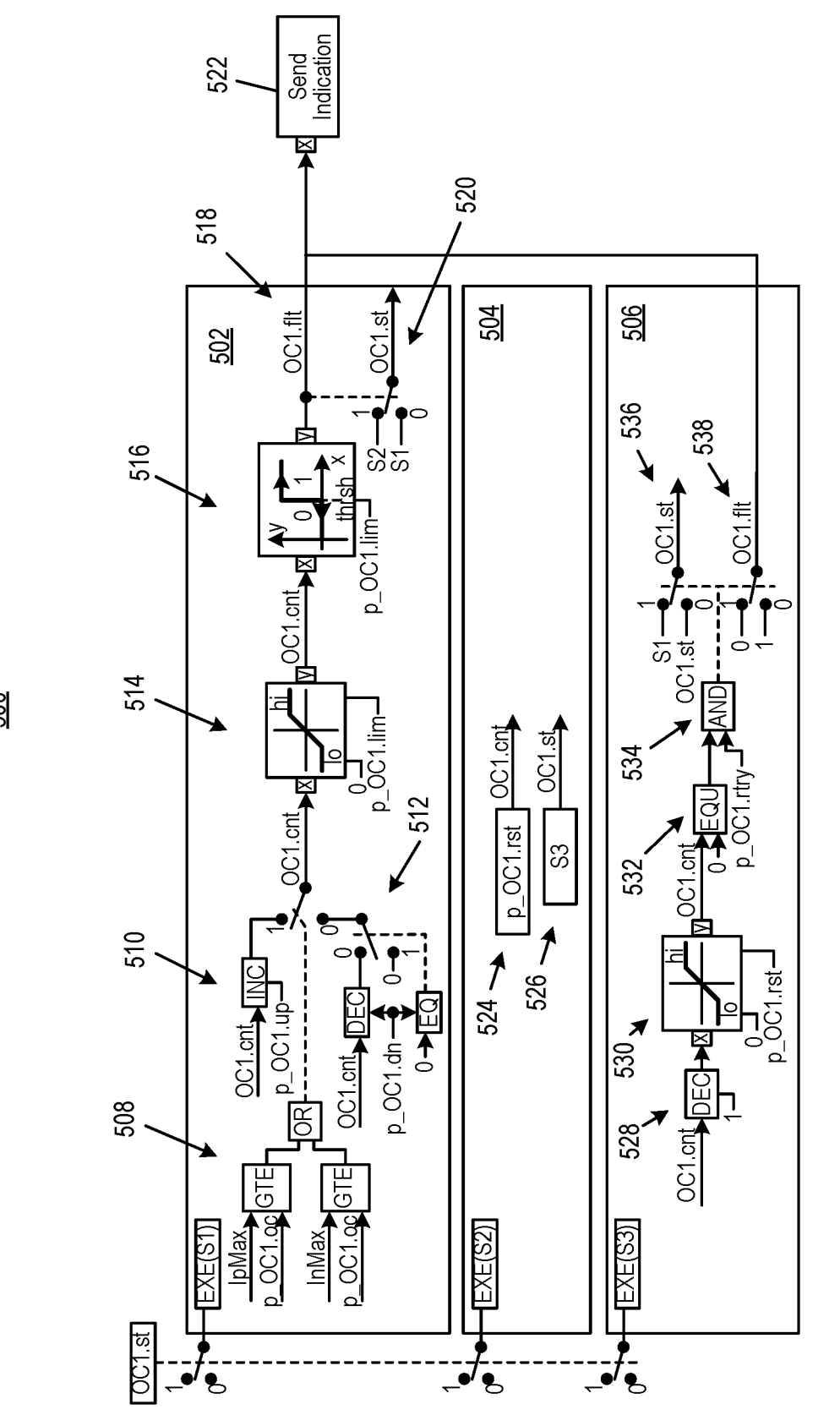
FIG. 5 depicts a control structure for a first overcurrent threshold, in accordance with an embodiment.

FIG. 5 shows a control structure 500 for the first OC threshold, in accordance with an embodiment. At least the operation 316 can be described in conjunction with the control structure 500 of FIG. 5. The control structure 500 can include steps or operations executable by the state machine (or the data processing system 102), for example. The data processing system 102 (e.g., the state machine) can execute the operations of the control structure 500 to determine whether the first OC threshold is exceeded.

The state machine can be in a first state (e.g., S1) when initially executed by the data processing system 102. In the S1 state, the data processing system 102 executing the state machine can perform the steps in block 502. For example, at 508, the data processing system 102 can compare the first maximum current from the first sensor (e.g., 108A) and the second maximum current from the second sensor (e.g., 108B) to the predetermined first OC threshold (e.g., labeled as "p_OC1.oc"). The first OC threshold can include a predetermined value representing the magnitude of the current that can potentially damage the EMA 106. The first OC threshold can be (substantially) greater than an expected operating current but below a value for hardware overcurrent protection (e.g., may be implemented in the EMA 106 for protection against excessive current flow). If at least one of the first or the second maximum currents is greater than or equal to the first OC threshold, the data processing system 102 can proceed to step 510. Otherwise, if the first and the second maximum currents are below the first OC threshold, the data processing system 102 can proceed to step 512 or continue to operation 322, for example.

At 510, the data processing system 102 can increment a counter (e.g., labeled as "OC1.cnt") by a (pre-)configured increment value (e.g., labeled as "p_OC1.up"). The increment value can be predetermined by the user or the administrator, such as increment by 1, 5, 10, etc. At 512, if the first or the second maximum currents is below the first OC threshold, the data processing system 102 can determine whether the counter value is zero. If the counter value is zero, for example, the data processing system 102 can proceed to step 514 or directly to step 518, outputting signal '0' indicating that the first OC threshold is not exceeded. In such cases, the data processing system 102 can proceed to operation 322. If the counter value is greater than zero, the data processing system 102 can decrement the counter by a configured decrement value (e.g., labeled as "p_OC1.dn"). In some cases, the decrement value may be the same as the increment value. In some other cases, the decrement value can be different from the increment value, e.g., the increment value can be greater than or less than the decrement value depending on the configuration.

As discussed herein, the increment value, the decrement value, and/or a count limit (e.g., for triggering a corresponding fault condition) can be configured for increasing or reducing fault tolerance, margin of error, or leniency of triggering the fault. For example, increasing the increment value, reducing the decrement value, or reducing the count limit can decrease the fault tolerance for triggering the fault condition corresponding to the first OC threshold. In another example, decreasing the increment value, increasing the decrement value, or increasing the count limit can increase the fault tolerance for triggering the fault condition corresponding to the first OC threshold. These values can be adjusted similarly for the triggering of other fault conditions as discussed herein. The counter increment or decrement can be performed at individual clock cycles, such as every 50 milliseconds (ms), 100 ms, etc.

At 514, the counter value can be capped or limited. The lower limit and the upper limit can be calibratable by the administrator of the system 100 or the data processing system 102. For example, the lower limit of the counter can be zero and the upper limit of the counter can be a value at or above a predefined count threshold (e.g., labeled as "p_OC1.lim"). In this case, the upper limit can correspond to the count threshold.

At 516, the data processing system 102 can determine whether the counter value is at or above a predetermined count threshold. For example, if the counter is below the count threshold, the state machine in S1 can output a relatively low signal (e.g., '0') or may not output a signal (e.g., result of block 502). In such cases, at 518, an indication of the fault (e.g., labeled as "OC1.flt") can be '0', indicating that a fault is not detected. At 520, with the output of '0', the state (e.g., labeled as "OC1.st") of the state machine can remain in S1, and the steps of block 502 can be repeated/iterated. In some cases, if the data processing system 102 does not detect the fault (e.g., the first OC threshold is not exceeded), the data processing system 102 can proceed to operation 322. In various configurations, the operations of the state machine discussed herein, such as but not limited to FIGS. 5-7, can be performed concurrently, independently, or serially.

Referring back to 516, if the counter is at or above the count threshold, the state machine can output a relatively high signal (e.g., '1'), indicating that there is a fault corresponding to the first OC threshold (e.g., OC1.flt=1 at 518). For example, if the count threshold is 30, with the increment value of 10, the counter value can reach the count threshold within 3 consecutive clock cycles of the IpMax or the InMax being at or above the predetermined first OC value. For each clock cycle that the IpMax or the InMax is below the first OC threshold, the counter value can be reduced, which may increase the number of clock cycles until the counter value reaches the count threshold. In another example, if the count threshold is 10 and the increment value is 10, the state machine can detect the fault in response to the IpMax or the InMax being at or above the first OC threshold (e.g., in a single iteration of block 502 or in a single clock cycle). Reaching the count threshold can correspond to detecting the first OC threshold being exceeded, corresponding to operation 316.

In this case, at 520, the state of the state machine can be updated to a second state (e.g., S2), such that the steps of block 504 corresponding to S2 can be performed in a subsequent clock cycle. At 522, the state machine can send an indication of the fault (e.g., OC1.flt or a fault state) to the data processing system 102. In some cases, at 522, the data processing system 102 can send or provide the indication of the fault to the display device for display to the user via the GUI. In response to detecting the fault (e.g., the first OC threshold exceeded), the data processing system 102 can proceed to operation 318. The state machine can be in the S2 state in response to OC1.flt=1.

At block 504, in the S2 state, the data processing system 102 (e.g., the state machine) can update the counter value in response to the fault detection. For example, at 524, the state machine can update the counter value to a predetermined reset value (e.g., labeled as "p_OC1.rst"). In some cases, the predetermined reset value can be the same as the predetermined count threshold value. In some cases, the predetermined reset value can be greater than or less than the count threshold value. For example, a relatively higher reset value for updating the counter value can increase the duration for when the power converter is disabled (e.g., corresponding to operation 318) or delay executing the retry strategy (e.g., corresponding to operation 320). A relatively lower reset value can reduce the duration to execute the retry strategy (e.g., corresponding to operation 320) for the EMA 106. The reset value may be referred to as a cooldown value (e.g., for a cooldown period), which can be predetermined or configured by the administrator. In some other cases, the state machine may maintain the counter value from block 502. At 526, the state machine can switch to a third state (e.g., S3) to execute the steps of block 506 in a subsequent clock cycle. In some configurations, the predetermined reset value may be zero, such that the state machine can switch back to S1 after switching to S3 (e.g., in the next clock cycle).

In block 506, the data processing system (e.g., the state machine) can perform a counter reset by decrementing the counter value. For example, at 528, the data processing system 102 can decrement the counter value by the decrement value. At 530, the data processing system 102 can limit the counter value to the predetermined lower limit and the predetermined upper limit. The lower limit can be zero, such that the counter value does not decrement below zero. At 532, the data processing system 102 can output a low signal (e.g., '0') if the counter is not zero. The steps 528-532 can be repeated until the counter value is zero. In response to the counter value reaching zero, the data processing system 102 can output a high signal (e.g., '1'), at 532. In some implementations, the data processing system 102 may perform the operation 318 until the counter value is zero. In response to the counter value reaching zero, the data processing system 102 can proceed to operation 320 to execute a retry strategy. The signal "p_OC1.rtry" can be used as part of the logic AND condition at 534 to determine, for example, after the count value has decremented to zero, whether to clear the fault and return to S1, thereby commencing normal operation. For example, if p_OCx.rtry=0, the data processing system 102 (or the state machine) is to skip executing the retry. In this example, the state machine can remain in S3 and the fault indication can remain at '1', thereby prohibiting the data processing system 102 from operating certain operations of (or sending commands to) the H-bridge. In another example, if the p_OCx.rtry=1, when the counter is decremented to zero in S3, at 534, the state machine can clear the fault signal and transition to S1. Clearing the fault signal can allow the data processing system 102 (e.g., microcontroller or the higher level controller) to resume operation of the H-bridge, for example.

At 534, if the retry strategy is to be executed and the counter value is zero, the output can be at a relatively high signal, e.g., a signal above a predetermined threshold, or a signal value in an uppermost or second highest quartile of signal values, for example. Otherwise, the output can remain as a relatively low signal, e.g., a signal below a predetermined threshold or a signal value in a lowermost or second lowest quartile of signal values, thereby maintaining the state of the state machine at S3 (e.g., iterate decrementing the counter value). For example, at 536, the state of the state machine can be switched back to S1 for the high signal from 534 or remain at S3 for the low signal. At 538, the fault indication can be switched to '0' (e.g., indicating there is no fault) for the high signal from 534 or the fault indication can be maintained at '1' for the low signal. The data processing system 102 can send an update (e.g., at 522) or communicate with a communication interface when the fault indication is reset. The update may be an audio or audiovisual notification, an e-mail message, an SMS message or alarm, etc.

Referring to operation 318, if the first OC threshold is exceeded (or the counter value exceeds a count threshold), the data processing system 102 can disable the power converter, e.g., to protect the EMA 106 from potential electrical damage. Disabling the power converter can include switching off one or more (or all) of the transistors 112 of the H-bridge. After disabling the power converter (or after the counter value has reached zero at block 506), the data processing system 102 can execute the retry strategy, at operation 320. The retry strategy can include resuming the operation of the power converter and the EMA 106 (e.g., reactivating the power converter). The retry strategy may include resetting or updating the control strategy of the system 100. The counter can define the duration for when to reactivate the power converter. The data processing system 102 can iterate the operations starting at operation 304, as part of the retry strategy.

At operation 322, the data processing system 102 can execute the state machine for the second OC threshold. The execution of the state machine for the second OC threshold can include determining whether the second OC threshold has been exceeded by the absolute maximum current from the sensors 108, e.g., at operation 324. The second OC threshold value can be relatively lower than the first OC threshold value, but relatively higher than the expected operating current value, for example. For example, a current value that is at or above the second OC threshold but below the first OC threshold may not significantly degrade the EMA 106. As such, the data processing system 102 can maintain the operation of the EMA 106 (and the power converter) with a reduced duty ratio (e.g., at operation 326). In this case, the power converter can switch from a powering mode to a recirculation mode. Although not shown in FIG. 3, the overcurrent control strategy in response to the second OC threshold being exceeded can include the retry strategy, similar to the operation 320. The states of the overcurrent strategies (e.g., for first and second OC thresholds) can be obtained by the data processing system 102 from the state machine or can be reported to the user.

Figure 6:
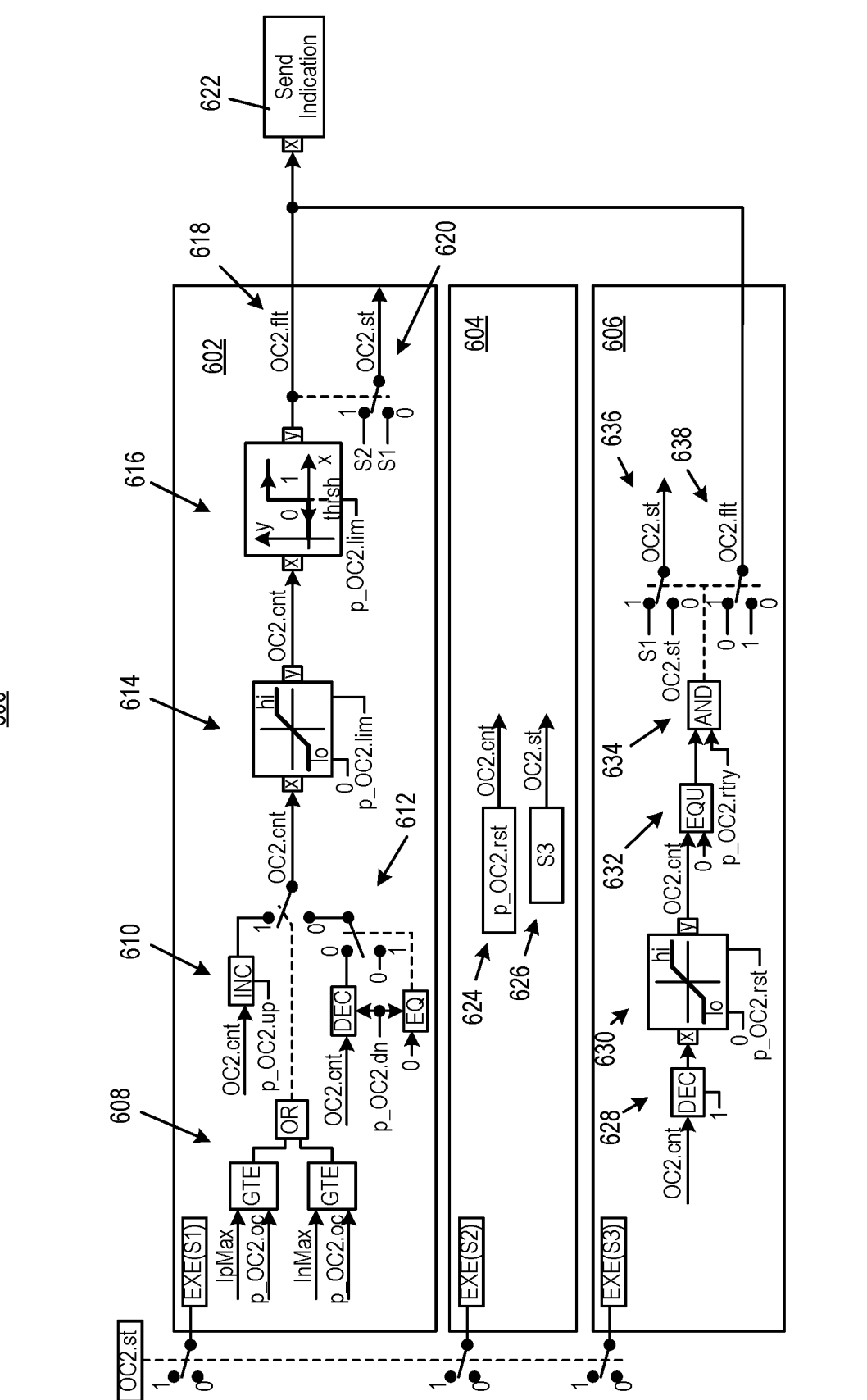
FIG. 6 depicts a control structure for a second overcurrent threshold, in accordance with an embodiment.

The operations 322-324 can be described in conjunction with but not limited to FIG. 6. FIG. 6 depicts a control structure 600 for a second overcurrent threshold, in accordance with an embodiment. The one or more steps of the control structure 600 can be similar to the steps of the control structure 500 of FIG. 5. For example, the executed state machine can start the operations in a first state (e.g., execute S1 corresponding to block 602). At 608, the data processing system 102 (e.g., the state machine) can compare the maximum current from the first sensor and/or the second sensor to a predetermined second OC threshold value (e.g. labeled as "p_OC2.oc"). If at least one of the maximum currents is greater than or equal to the second OC threshold, a high signal is generated, and the state machine proceeds to 610. Otherwise, a low signal is generated and the state machine proceeds to 612.

At 610, the state machine can increment a counter by a predetermined increment value. The counter of the control structure 600 can be a separate counter from the control structure 500. The state machine can proceed to the next step of block 602 after incrementing the counter value. At 612, if the counter value is zero, the state machine can proceed to the next step of block 602, or proceed directly to step 618. If the counter is not zero, the state machine can decrement the counter by a predetermined decrement value. In some configurations, concurrent to performing the step 612, the data processing system 102 can determine that the second OC threshold is not exceeded, and proceed to operation 304 to iterate the method 300.

At 614, the state machine can apply an upper limit and a lower limit to the counter value. The upper limit and the lower limit can be predetermined by the user. At 616, the state machine can compare the counter value to a predetermined count threshold. At 618, a low signal can be generated if the counter value is not at or above the count threshold (e.g., setting the fault indication to '0'). At 618, a high value can be generated if the counter value is at or above the count threshold (e.g., setting the fault indication to '1'). The fault indication associated with the second OC threshold can be labeled as "OC2.flt". At 622, the state machine can send the fault state to the data processing system 102. For example, the data processing system 102 can receive an indication of whether a fault is detected based on the fault indication from the state machine. If the fault is detected, the data processing system 102 can proceed to operation 326. Otherwise, if the fault is not detected, the data processing system 102 can proceed to operation 304, for example.

At 620, if the low signal is generated from step 616, the state machine can iterate the steps of block 602. Otherwise, if the high signal is generated from step 616, the state machine can switch its state to a second state (e.g., S2). In such cases, the state machine can execute the steps of block 604, corresponding to S2.

In block 604, the data processing system 102 (e.g., the state machine) can update the counter value to a reset value and set the state machine to a third state (e.g., S3). For example, at 624, the state machine can set the counter value to a reset value (e.g., labeled as "p_OC2.rst"). In some implementations, if the reset value is zero, the data processing system 102 may execute a retry strategy in a subsequent clock cycle. In some cases, the reset value can represent the duration for which the duty ratio of the power converter is reduced (e.g., corresponding to operation 326) or the duration until executing the retry strategy (e.g., similar to operation 320). At 626, the state machine can be set to S3.

For S3, the state machine can perform the steps of block 606. At 628, the state machine can decrement the counter value by the predetermined decrement value. At 630, the state machine can apply the predetermined upper limit and/or the predetermined lower limit to the counter value. At 632, the state machine can generate a high signal when the counter value equals zero or a low signal when the counter value does not equal zero. At 634, the state machine can generate a high signal when a retry strategy is to be executed and the signal '1' is received from the step 632. Otherwise, the state machine can generate a low signal at step 634. The high signal from step 634 can indicate that the counter value has been reset. At 636, the state machine can maintain its S3 state until the high signal is generated from step 634. In response to the high signal, at 636, the state of the state machine can be updated to S1. At 638, for the low signal from step 634, the fault indication can remain active (e.g., OC2.flt=1). At 638, for the high signal from step 634, the fault indication can be reset (e.g., OC2.flt=0), and the state machine can send the updated fault indication to the data processing system 102, at 622, for example.

At operation 326, the data processing system 102 can limit or reduce the output duty ratio of the power converter (e.g., one or more transistors 112 of the H-bridge), in response to determining that the second OC threshold is exceeded (e.g., the counter value at or above the count threshold). In some implementations, reducing the duty ratio can be a part of the retry strategy (e.g., similar to operation 320). The data processing system 102 can reduce the duty ratio of the power converter, for instance, by adjusting the triangle wave carrier 402, adjusting the power level of the one or more transistors 112, or adjusting the peak or valley of the triangle wave carrier 402, among others. For example, the duty ratio can be controlled by the adjustment of the duty signal (e.g., labeled as "Dty"). The duty signal can be associated with the triangle wave carrier 402, such as described in conjunction with at least FIG. 4. The PWM signal can include the duty ratio for the power converter. The duty ratio may be described as the time the PWM signal is on (e.g., high level) divided by the PWM signal switching period. The PWM signal can be obtained from the comparison of the duty signal to the triangle wave carrier 402. When the duty signal is above the triangle wave carrier 402, the PWM signal can be on. In some cases, when the duty signal is below the triangle wave carrier 402, the PWM signal can be off. The triangle wave carrier 402, the duty signal, and the subsequent generation of the PWM signal can be implemented in the data processing system 102 (e.g., hardware or the microcontroller). The data processing system 102 can adjust the duty signal to control with PWM signal duty ratio. According to at least operations 312-326, the data processing system 102 can detect, diagnose, and take a recovery action in response to experiencing overcurrent above at least one of the first OC threshold or the second OC threshold.

Referring now to operation 328, the data processing system 102 can compute or determine the averages of the samples. For example, the data processing system 102 can determine a first average value from the first electrical data (e.g., a sample) from the first current sensor. The data processing system 102 can determine a second average value from the second electrical data from the second sensor. In some cases, the data processing system 102 can determine average values from samples of the first sensor and the second sensor measured over time. In this case, the data processing system 102 can determine a first set of average values from the first electrical data associated with the first sensor and a second set of average values from the second electrical data associated with the second sensor.

At operation 330, the data processing system 102 can compute or determine a difference between the first average value and the second average value. The data processing system 102 can determine the difference measured over time. For example, the time window of the samples from the first sensor and the second sensor can be synced. The data processing system 102 can compute various differences between the first set of average values and the second set of average values captured over a time period. The data processing system 102 can provide the one or more differences as inputs to the state machine for fault detection operations.

At operation 332, the data processing system 102 can execute the state machine to perform pattern identification to detect any potential fault impedance. For example, the data processing system 102 can execute the state machine to determine whether a type of fault impedance is present, at operation 334. The steps of operations 332-334 can be performed or described in conjunction with but not limited to FIG. 7.

Figure 7:
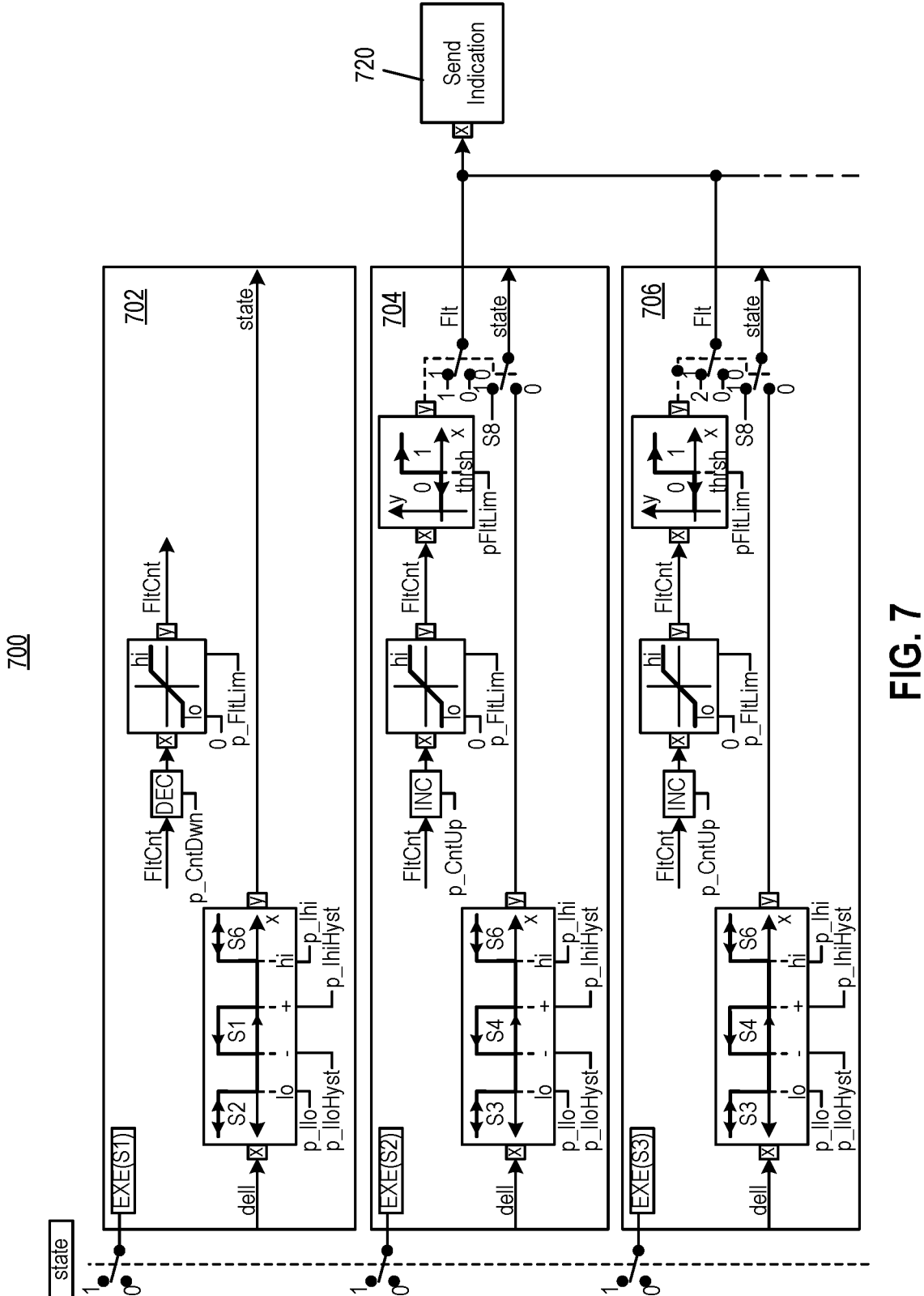
FIG. 7 depicts a control structure for a fault impedance identification, in accordance with an embodiment.
Figure 7:
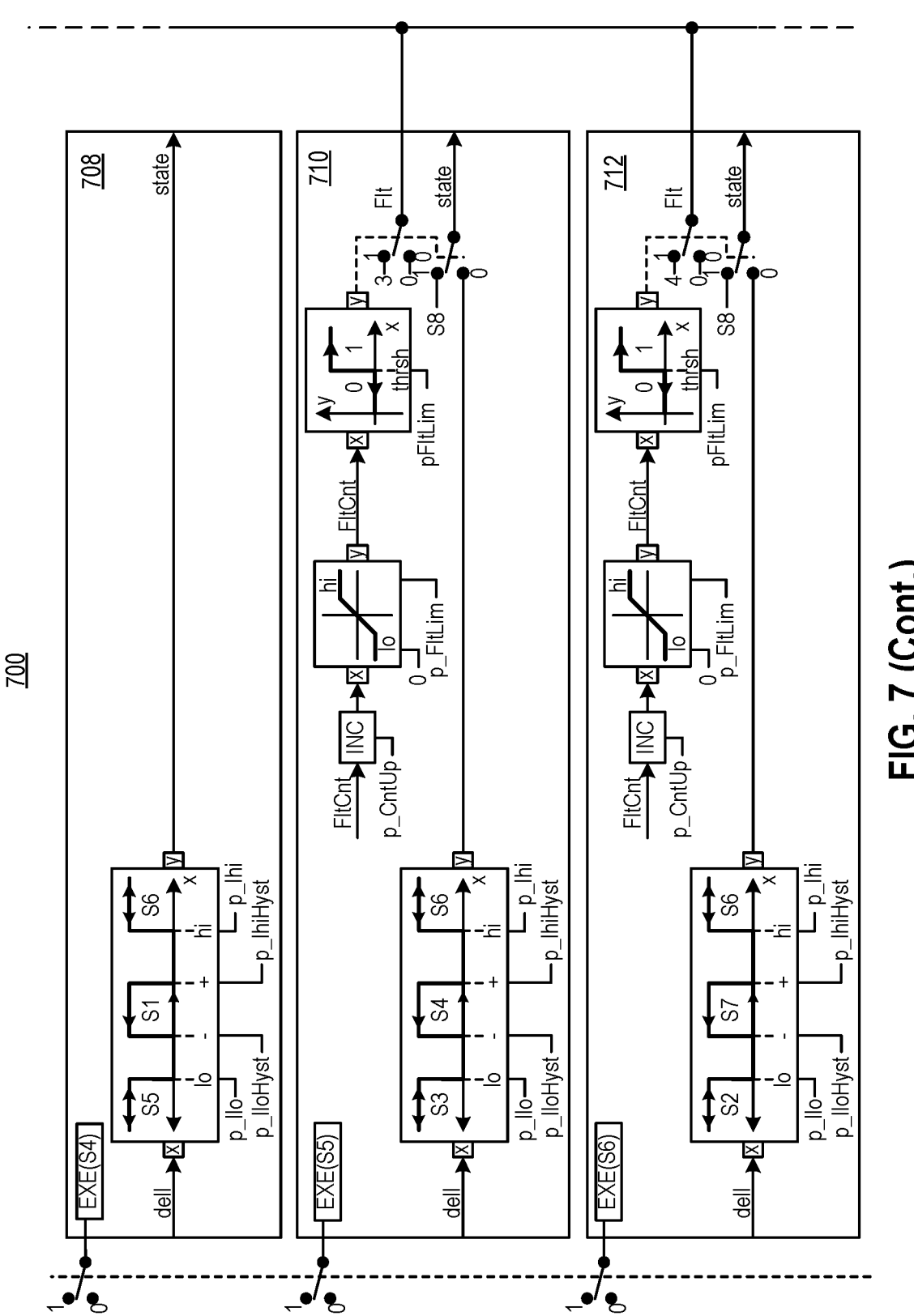
Figure 7:
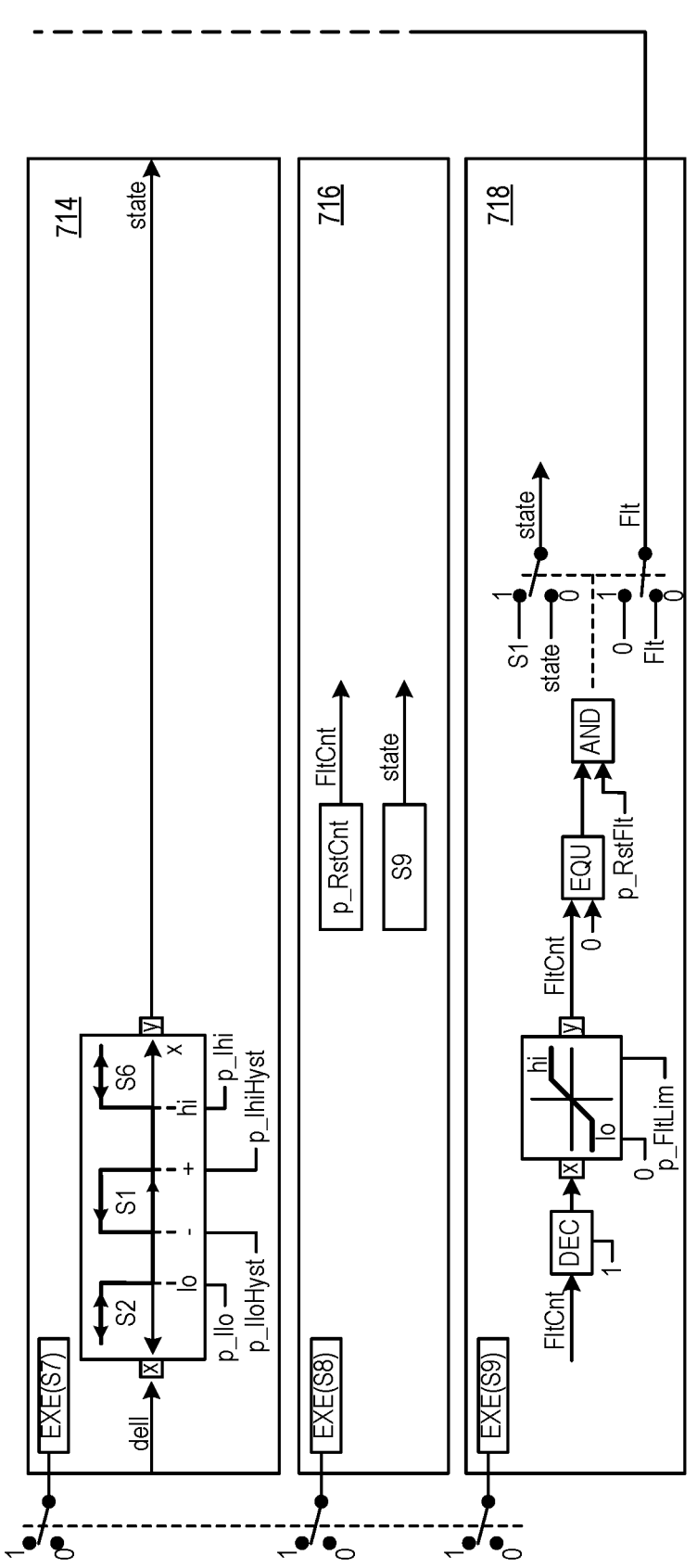

FIG. 7 depicts a control structure 700 for a fault impedance identification, in accordance with an embodiment. One or more steps of the control structure 700 can include or be similar to one or more steps of but not limited to at least one of the control structures 500, 600 of FIGS. 5-6. The various steps of the control structure 700 can be associated with a respective state of the state machine, such as a first state to a ninth state (e.g., S1-S9), although the state machine may include more or less states. The data processing system 102 (e.g., the state machine) can be in different states depending on the electrical values measured by the sensors 108 over time. The different states can include similar or different steps/operations from each other. Depending on the pattern of the electrical data (e.g., the pattern of the difference between the average current data from the first sensor and the second sensor), the data processing system 102 (e.g., the state machine) can trigger an indication of a type of fault accordingly. It should be noted that the average of the electrical data is used herein as an example, and other metrics can be used similarly for executing the operations discussed herein, such as the mean, median, or mode of the electrical data.

Figure 8:
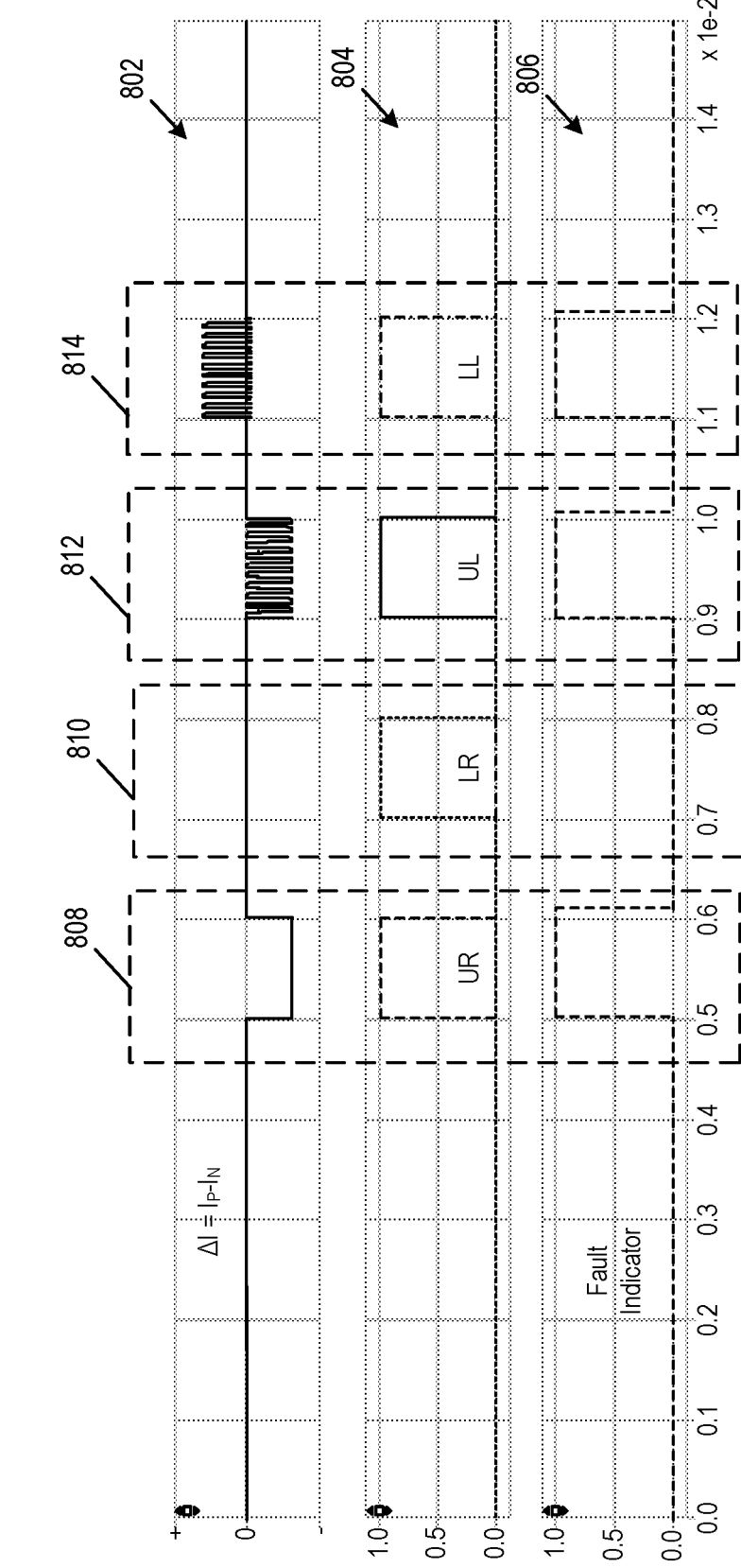
FIG. 8 depicts a waveform diagram for different types of fault impedances, in accordance with an embodiment.

For purposes of providing examples in executing the steps of the control structure 700 of FIG. 7, such as the switching of the states and the provided indication from the state machine, these steps can be described in conjunction with but not limited to FIG. 8. FIG. 8 depicts an example waveform diagram 800 for different types of fault impedances, in accordance with an embodiment. The waveform diagram 800 is provided as an example, and may be different depending on the configuration of the system 100.

As shown, the waveform diagram 800 includes graphs 802, 804, 806. The graph 802 can include a waveform (or signals) of the difference between average values of the first electrical data and the second electrical data over time. The graph 804 can include a waveform indicating the type of fault (or the location of the fault) simulated in the circuit, for instance, similar to the type of faults shown in at least one of but not limited to FIGS. 2A-D. The fault discussed in association with at least FIGS. 2A-F, 7, and 8 can refer to a type of impedance fault. The graph 806 can include a waveform of the fault indicator indicating a respective type of fault associated with the simulated fault (e.g., graph 804) and the computed differences (e.g., graph 802). For example, portion 808 shows examples of the computed differences and the fault indicator being triggered for a second type of impedance fault (e.g., Flt=2). The second type of impedance fault can be associated with the UR portion of the H-bridge, for example. Portion 810 shows examples of the computed differences and the fault indicator being triggered for a first type of impedance fault (e.g., Flt=1), associated with the LR portion of the H-bridge. Portion 812 shows examples of the computed differences and the fault indicator being triggered for a third type of impedance fault (e.g., Flt=3), associated with the UL portion of the H-bridge. Portion 814 shows examples of the computed differences and the fault indicator being triggered for a fourth type of impedance fault (e.g., Flt=4), associated with the LL portion of the H-bridge. The simulation of but not limited to these types of faults can be described in conjunction with the control structure 700 of FIG. 7.

For example, when executing the state machine, the state machine can be in S1, executing the operation of block 702. At S1, the state machine can monitor the difference between the first average value and the second average value. If the difference is at or below a predetermined lower difference threshold (e.g., a predefined negative value, sometimes referred to as a negative threshold), the state machine can execute S2 in a subsequent clock cycle or after completing the steps of block 702. If the difference is at or above a predetermined upper difference threshold (e.g., a predefined positive value, sometimes referred to as a positive threshold), the state machine can subsequently execute S6. Otherwise, if the difference is between the lower difference threshold and the upper difference threshold, the state machine can remain in S1. The data processing system 102 (or the state machine) can maintain a counter, different from the counters of the control structures 500, 600. In S1, if the counter value is greater than zero, the state machine can decrement the counter value by a predetermined decrement value.

In conjunction with simulating the second type of fault, such as shown in portion 808, the computed difference can be relatively consecutively at or below the lower difference threshold over a time period. For example, if the monitored difference is less than the lower difference threshold, the state machine can proceed to S2 (e.g., block 704). At S2, the state machine can increment the counter value by a predetermined increment value. For purposes of providing examples herein, the increment value can be 10. The counter value can be limited between predefined upper and lower limits, such as described in conjunction with at least steps 514, 614. For providing examples herein, the upper limit can be 50, corresponding to the predetermined count threshold, and the lower limit can be zero. The state machine can compare the counter value to the count threshold. At this stage, the counter value can be below the count threshold, and the fault indicator (e.g., labeled as "Flt") remains at zero (e.g., Flt=0).

At S2, the state machine can compare the monitored difference (e.g., from a different sample) to the upper and lower difference threshold. As shown in block 704 of FIG. 7, the state can be switched to S3 if the difference is at or below the lower difference threshold. The state can be switched to S4 if the difference is between the difference thresholds. The state can be switched to S6 if the difference is at or above the upper difference threshold. In this case, for simulating the second type of fault, the difference can be at or below the lower different threshold, and the state machine can proceed to S3 (e.g., block 706).

At S3, the state machine can increment the counter value, contain the counter value within the upper and lower limits, and compare the counter value to the count threshold. As shown in block 706, the state can be maintained as S3 in a subsequent clock cycle if the monitored difference remains at or below the lower different threshold. The switching of the states in block 706 can be similar to block 704, for example. In the case of the second type of fault, the state machine can iterate the steps of S3, thereby incrementing the counter value until the counter value satisfies or reaches the count threshold. In response to the counter value being at or above the count threshold, the state machine can set a fault indicator, as shown in block 706. In this case, the fault indicator can be set to 2 (e.g., Flt=2), indicating that the system 100 is experiencing the second type of fault.

As shown in portion 808, the pattern associated with the second type of fault can include a relatively constant negative value for the computed difference over a time period. The state machine can send the indication of the fault to the data processing system 102, at 720 (e.g., similar to operations 522 or 622). Subsequent or concurrent to setting the fault indication (e.g., any of the fault indications discussed herein), the state machine can switch to S8, e.g., perform the steps of block 716 in a subsequent clock cycle to reset the counter value.

In the case of simulating the first type of fault, such as shown in portion 810, the first average and the second average may remain similar to each other, and the computed difference may be around zero. In this example, the fault indicator may not be triggered for the first type of fault (e.g., located in the LR of the H-bridge), and the power converter can remain in normal operating condition. For purposes of providing examples, in the control structure 700, the first type of fault may be triggered if the counter value has reached the count threshold in response to the increment at S2. In some implementations, referring to at least one of FIGS. 2A-F, the left side of the H-bridge may be in PWM mode where the upper left (e.g., gate driver 110A and/or transistor 112A) and the lower left (e.g., gate driver 110C and/or transistor 112C) power devices are alternatively being turned on and off at the switching frequency. The right side of the H-bridge may not be in PWM mode. For the simulation of the first type of fault (e.g., LR fault) described in conjunction with FIG. 8, the lower right power device (e.g., gate driver 110D and/or transistor 112D) can be "ON" 100% of the time and the upper right power device (e.g., gate driver 110B and/or transistor 112B) can always be "OFF". In the portion of 810, the fault impedance is on the LR side of the H-bridge, e.g., in parallel with the lower right power device (e.g., gate driver 110D and/or transistor 112D), as such, there may be no objectionable behavior in the power converter or the electromechanical actuator 106.

In conjunction with simulating the third type of fault, such as shown in portion 812, the computed difference can be modulated between being within the difference thresholds and being at or below the lower difference threshold over a time period. For example, in response to the difference being at or below the lower difference threshold, the state machine can switch to S2 (e.g., block 704) in a subsequent clock cycle. In S2, the state machine can increment the counter value, and if the computed difference is within the difference thresholds, the state machine can switch to S4 (e.g., block 708) in a subsequent clock cycle.

In S4, as shown in block 708, the state machine can switch to S5 if the computed difference is at or below the lower difference threshold. The state machine can switch to S6 if the computed difference is at or above the upper difference threshold. The state machine can switch to S1 if the difference is between the difference thresholds (e.g., to decrease the counter value). In simulating the third type of fault, the difference can be at or below the lower threshold. As such, the state machine can proceed to S5 (e.g., block 710).

In S5, as shown in block 710, the state machine can increment the counter value, contain the counter value within the upper or lower limits/bounds, and compare the counter value to the count threshold. For the next state, the state machine can switch to S3 if the computed difference remains at or below the lower difference threshold. The state machine can switch to S6 if the difference is at or above the upper difference threshold. The state machine can switch to S4 if the difference is between the difference thresholds. For simulating the third type of fault, the computed difference at this stage can be between the difference threshold. Hence, the state machine can return to S4 after executing S5. In this case, the state machine can iterate between S4 and S5 until the counter value reaches the count threshold.

When the counter value is at or above the count threshold at S5, the fault indicator can be set to '3' (e.g., Flt=3), indicating that the third type of fault is detected. The next state of the state machine can be set to S8. As shown in portion 812, the pattern associated with the third type of fault can include a modulation between around 0 and a negative value for the computed difference over a time period. The switching between S4 and S5 can be associated with the modulated signal, as shown in the waveform of graph 802, for example.

In conjunction with simulating the fourth type of fault, such as shown in portion 814, the computed difference can be at or above the upper difference threshold over a time period. For example, in S1, in response to the computed difference being at or above the upper difference threshold, the state machine can proceed to S6 (e.g., block 712). In S6, the state machine can increment the counter value, contain the counter value within the upper and lower limits, and compare the counter value to the count threshold.

For the next state, the state machine can switch to S2 if the computed difference is at or below the lower difference threshold. The state machine can switch to S7 if the computed difference is between the difference thresholds. The state machine can remain in S6 if the computed difference is at or above the upper difference threshold. In simulating the fourth type of fault, the computed difference can be at or above the upper difference threshold (e.g., remain in S6) or be between the difference thresholds (e.g., switch to S7 to perform the steps of block 714).

In S7, the state machine can determine its next state. For example, the state machine can switch to S2 if the computed difference is at or below the lower difference threshold. The state machine can switch to S1 if the computed difference is between the difference thresholds. The state machine can remain in S6 if the computed difference is at or above the upper difference threshold. In simulating the fourth type of the fault, the computed difference in S7 may be at or above the upper difference threshold. As such, the state machine can switch back to S6. The state machine may remain in S6 or switch between S6 and S7 for the fourth type of fault. In response to the counter value reaching the count threshold, such as in block 712, the fault indicator can be set to '4' (e.g., Flt=4), indicating that the system 100 is experiencing the fourth type of fault. The next state of the state machine can be set to S8. As shown in portion 814, the pattern for the fourth type of fault can include positive difference values (e.g., at or above the upper difference threshold) computed over time, which may or may not include modulations between the positive value and around zero.

In response to the detection of any type of fault (e.g., associated with a location of the fault), the state machine can be in S8 (e.g., execute block 716). In block 716, the state machine can set the counter value to a predetermined reset value. The state machine can set S9 (e.g., block 718) as the next state. In S9, the state machine can decrement the counter value, contained within the upper and lower limits. When the counter value reaches zero, and an indication to reset the fault or execute a retry strategy is received (e.g., labeled as "p_RstFlt"), the state machine can generate a high signal. In response to the high output signal in S9, the fault indicator can be reset to 0 (e.g., no fault detected), and the next state of the state machine can be set to S1 (e.g., default state). Otherwise, the fault indicator can be maintained (e.g., at least one of 1, 2, 3, 4, etc.), and the next state of the state machine can remain in S9. In some implementations, the steps of block 718 can be similar to at least one of blocks 506, 606.

In some configurations, the counter (and the counter value associated with the counter) can be independent between one or more different states. For instance, the counter of S2 can be different from the counter of S3, the counter of S5 can be different from the counter of S6, the counter of S5 can be different from the counter of S3, etc. In some implementations, the fault impedance detection may be performed when the fault impedance is not within a range to trip the over-current setpoints (e.g., the first or the second OC thresholds). The identification of the fault impedance can be performed to determine when the fault impedance connects an output phase to power or ground, for example.

Referring back to operation 334, in response to detecting the presence of a type of fault impedance (e.g., detected a pattern associated with the computed difference over time or the counter value is at or above the count threshold), the data processing system 102 can proceed to operation 336. If the state machine does not detect any pattern, the data processing system 102 can proceed back to operation 304, thereby iterating the fault detection process.

At operation 336, the data processing system 102 can reconfigure the power converter for relatively normal (or regulated) operation, in response to a detection of at least one fault impedance. In various configurations, after detecting the location of the impedance fault, corresponding to the type of fault, the data processing system 102 can control the one or more transistors 112 such that current does not flow to the impedance fault. For example, the data processing system 102 may open all power devices (e.g., the transistors 112) in the H-bridge, thereby disabling the power converter for a predefined duration. The predefined duration can be associated with the reset value configured for the counter, such as in block 716, which can be decremented in block 718. In this case, the data processing system 102 can reset the power devices after the predefined duration or after the counter value (of the control structure 700) reaches zero. Opening the power devices can prevent control of the EMA 106.

In another example, the data processing system 102 may close at least one power device that is in parallel with the fault impedance location. For instance, for the first type of fault, the data processing system 102 can close the transistor 112C. For the second type of fault, the data processing system 102 can close the transistor 112A. For the third type of fault, the data processing system 102 can close the transistor 112B. For the fourth type of fault, the data processing system 102 can close the transistor 112D. In such cases, the power devices in the other leg or side of the H-bridge can be used to provide power to the EMA 106, thereby maintaining a portion of control of the EMA 106.

At operation 338, the data processing system 102 can execute the retry strategy. The retry strategy of operation 338 can be similar to operation 320, for example. The data processing system 102 can iterate any of the operations discussed herein, such as returning to operation 304. In some implementations, one or more operations of the example method 300 can be performed concurrently. In some implementations, one or more operations of the example method 300 can be performed sequentially or independently.

In some cases, the data processing system 102 can adjust the control over the transistors 112 according to the magnitude of the measured current (e.g., indicating the severity of the impedance fault) from the first or the second sensors. For example, in response to detecting the fault impedance, the data processing system 102 can adjust the power level for one or more transistors 112 of the power converter, such as depending on at least the magnitude of the electrical data. Hence, by detecting the location and the severity of the fault, the data processing system 102 can perform one or more configured control strategies to recover from the fault, thereby minimizing the degradation of the electrical components, extending the useful life of the electrical components, and maintaining at least a portion of control over the EMA 106 depending on the type of fault, among other benefits.

Figure 9:
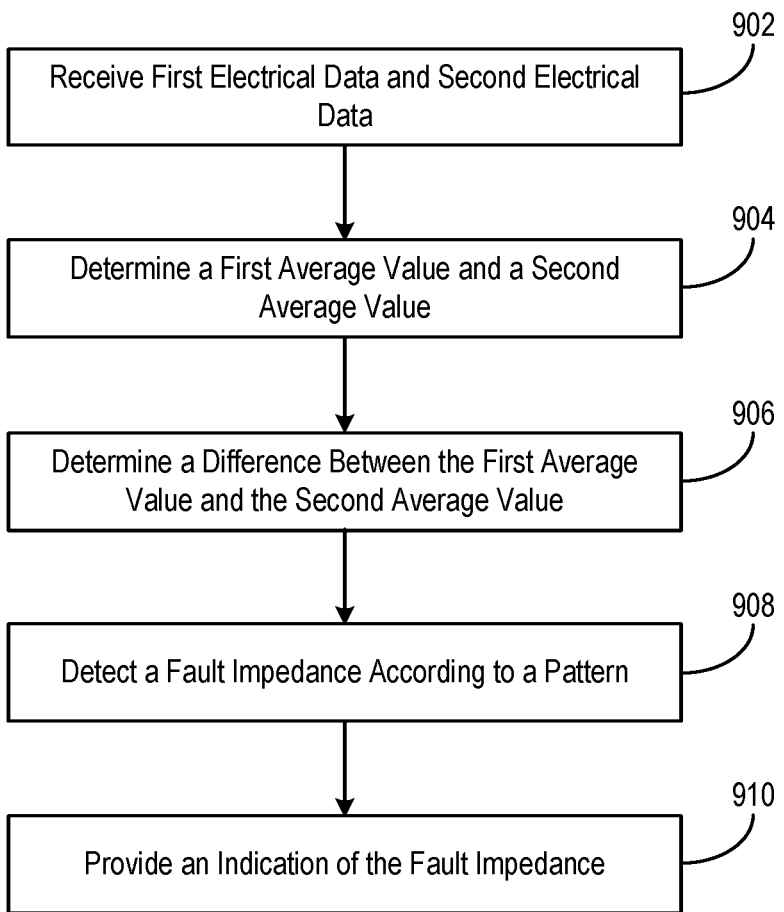
FIG. 9 is a flow diagram depicting an example method for fault detection, diagnosis, and recovery in an electromechanical actuator, in accordance with an implementation.

FIG. 9 depicts a flow diagram depicting an example method 900 for fault detection, diagnosis, and recovery in an electromechanical actuator, in accordance with an implementation. The example method 900 can be performed by one or more systems, components, or functions depicted in FIG. 1, including, for example, by the data processing system 102, the EMA 106, the sensors 108, the power converter, etc. In brief overview, the data processing system can receive first electrical data and second electrical data, at operation 902. At operation 904, the data processing system can determine a first average value and a second average value. At operation 906, the data processing system can determine a difference between the first average value and the second average value. At operation 908, the data processing system can detect a fault impedance according to a pattern. At operation 910, the data processing system can provide an indication of the fault impedance.

In further detail, at operation 902, the data processing system can receive first electrical data obtained from a first sensor and second electrical data obtained from a second sensor. The first sensor and the second sensor can be current sensors. The first and second electrical data can be current data from the current sensors. The first sensor can be positioned at a first terminal (e.g., positive terminal or power feed) of a power source. The second sensor can be positioned at a second terminal (e.g., negative terminal or return feed) of the power source.

In some implementations, receiving the electrical data can include the data processing system configuring or adjusting sampling instants associated with, for instance, a PWM waveform. The sampling instants can correspond to the time window or instances when the analog data from the first sensor and/or the second sensor are converted via at least one ADC to digital data, for example. The data processing system can configure one or more trigger windows within the sampling instants to capture a portion of the current data from the ADC, such as described in conjunction with but not limited to FIG. 4. For each trigger window, the data processing system can receive/obtain one or more samples of current data.

At operation 904, the data processing system can determine a first average value and a second average value. The data processing system can determine the first average value from the first electrical data and the second average value from the second electrical data. In some implementations, the first average value and the second average value can be associated with at least one trigger window. For example, the data processing system can obtain a plurality of measured data points (e.g., current data) within a respective trigger window. The data processing system can compute an average value of the current data within the trigger window for electrical data from the first sensor and the second sensor, thereby obtaining the first average value and the second average value. The data processing system can iterate computing the average for other trigger windows to obtain a plurality of average values measured or computed over time.

At operation 906, the data processing system can determine a difference between the first average value and the second average value. The data processing system can compute the difference between the first and the second average values over time. From the computed difference over time, the data processing system may detect at least one pattern indicative of at least one corresponding type of fault impedance.

At operation 908, the data processing system can detect a fault impedance according to a pattern of the difference between the first average value and the second average value over a measured time interval. The pattern of the computed difference can be described in conjunction with but not limited to FIGS. 3, 7, and 8, for example. In some cases, to detect the fault impedance, the data processing system can initiate a counter (having a counter value) configured to increment or decrement depending on whether at least one condition indicative of a potential fault is identified or detected. The counter value can be compared to a count threshold to determine whether to trigger a fault indication. The value used for incrementing or decrementing the timer can be predetermined. The value for the count threshold can be predetermined. A relatively higher increment value or a relatively lower count threshold can reduce the circuit tolerance to any potential fault indication, and vice versa. A relatively higher decrement value can reduce the time to reset or return the circuit to its normal operation, such as in response to fault detection.

In some implementations, the data processing system can increment a counter responsive to the difference between the first and second average values being greater than or equal to an upper threshold or less than or equal to a lower threshold, depending on the type of fault impedance potentially being detected. In some implementations, depending on the states of the data processing system (e.g., the state machine), the data processing system may decrement (e.g., S1 of FIG. 7) or maintain the counter value (e.g., S4 or S7 of FIG. 7). In various implementations, responsive to the counter value being greater than or equal to the count threshold, the data processing system (e.g., state machine) can detect the fault impedance or a type of fault impedance associated with the pattern of the electrical data, for example.

In some implementations, the data processing system can detect a location of the fault impedance according to the pattern of the difference between the first average value and the second average value over the measured time interval. For example, the pattern of the difference can indicate the type of fault experienced by the circuit (or system). The type of fault may be associated with or correspond to location of the fault associated with a power converter (e.g., one or more transistors of the H-bridge).

In some implementations, the data processing system may detect a first location of the fault impedance (e.g., the second type of fault, Flt=2) in response to the difference being lower than or equal to a lower threshold for a predetermined number of consecutive cycles. For example, if the difference is consecutively at or below the lower (difference) threshold, such as until the counter value reaches the count threshold, the second type of fault can be triggered. Based on the type of fault, the data processing system can determine the first location of the fault impedance.

In some implementations, the data processing system may detect a second location of the fault impedance (e.g., the third type of fault, Flt=3) in response to a modulation (or fluctuation) of the difference between being lower than or equal to a lower threshold and around zero for a predetermined number of cycles. For example, if the differences between the first and second average values over time fluctuate between around zero and a negative value (e.g., at or below the lower threshold), the third type of fault can be triggered. Based on the type of fault, in this case, the data processing system can determine the second location of the fault impedance.

In some implementations, the data processing system may detect a third location of the fault impedance (e.g., the fourth type of fault, Flt=4) in response to the difference being greater than or equal to an upper threshold for a predetermined number of cycles. In this case, the difference over a measured time interval may vary or be constant. For example, if the differences between the first and second average values over time are at or above an upper threshold, for instance, in a consecutive manner so as to generate a constant positive value or, alternatively, fluctuate between the positive value and around zero, the fourth type of fault can be triggered. Based on the type of fault, in this case, the data processing system can determine the third location of the fault impedance.

At operation 910, the data processing system can provide an indication of the fault impedance. For example, in response to detecting the fault impedance, the data processing system can provide, via a GUI of a display device, an indication of the fault impedance for display to the user. The data processing system can provide other information to the user via the GUI, such as the strategies being applied to control the circuit when a fault is detected.

In some implementations, in response to detecting the fault impedance, the data processing system may provide the indication of the fault impedance via but not limited to a communication bus, such as a communication area network (CAN), to initiate a recovery action. For example, the data processing system may send information regarding the type of fault (e.g., fault impedance) to a controller of a device (e.g., vehicle in this case), via the CAN. In such cases, the controller can determine, based on the detected fault, to take any suitable recovery action in response to the fault. In various configurations, the actions to take may be predetermined according to the fault type or condition of the system, for example.

In some implementations, responsive to detecting the fault impedance, the data processing system can send, to at least one gate driver associated with at least one respective transistor, a command to adjust electrical power to an electromechanical actuator. The electromechanical actuator can be electrically coupled to the power source via the at least one respective transistor. The command to adjust the electrical power to the electromechanical actuator can correspond to at least one control strategy predefined for the various types of fault (or fault impedance).

In some implementations, the data processing system can determine a first maximum value from the first electrical data and a second maximum value from the second electrical data. The maximum value can correspond to an absolute maximum value of a set of sample data. The data processing system can detect a first fault responsive to the first maximum value or the second maximum value being greater than or equal to a predetermined first threshold (e.g., the first OC threshold). For example, the data processing system can determine that the first maximum value or the second maximum value exceeds the predetermined first threshold for a measured time interval, a number of clock cycles, or until the counter reaches the count threshold. According to the determination, the data processing system can detect the first fault. Responsive to detecting the first fault, the data processing system can send, to at least one gate driver, a command to disable at least one transistor associated with the at least one gate driver, for instance, to disable the power converter. Disabling the power converter can prevent control of the electromechanical actuator (e.g., disabling power to the EMA).

In some implementations, the data processing system can detect a second fault responsive to the first maximum value or the second maximum value being greater than or equal to a predetermined second threshold (e.g., the second OC threshold). The predetermined second threshold can be lower than the predetermined first threshold. Responsive to the detection of the second fault, the data processing system can take action to recover from the fault. For example, the data processing system can send, to at least one gate driver associated with at least one respective transistor, a command to reduce electrical power for supply to an electromechanical actuator. In this case, to reduce the electrical power, the data processing system can adjust the duty ratio (or the power level) of the one or more transistors, thereby reducing the power supplied to the electromechanical actuator, for example.

In some implementations, the detection of the overcurrent may be referred to as hard fault detection. In some other implementations, the detection of the fault impedance may be referred to as soft fault detection.

Figure 10:
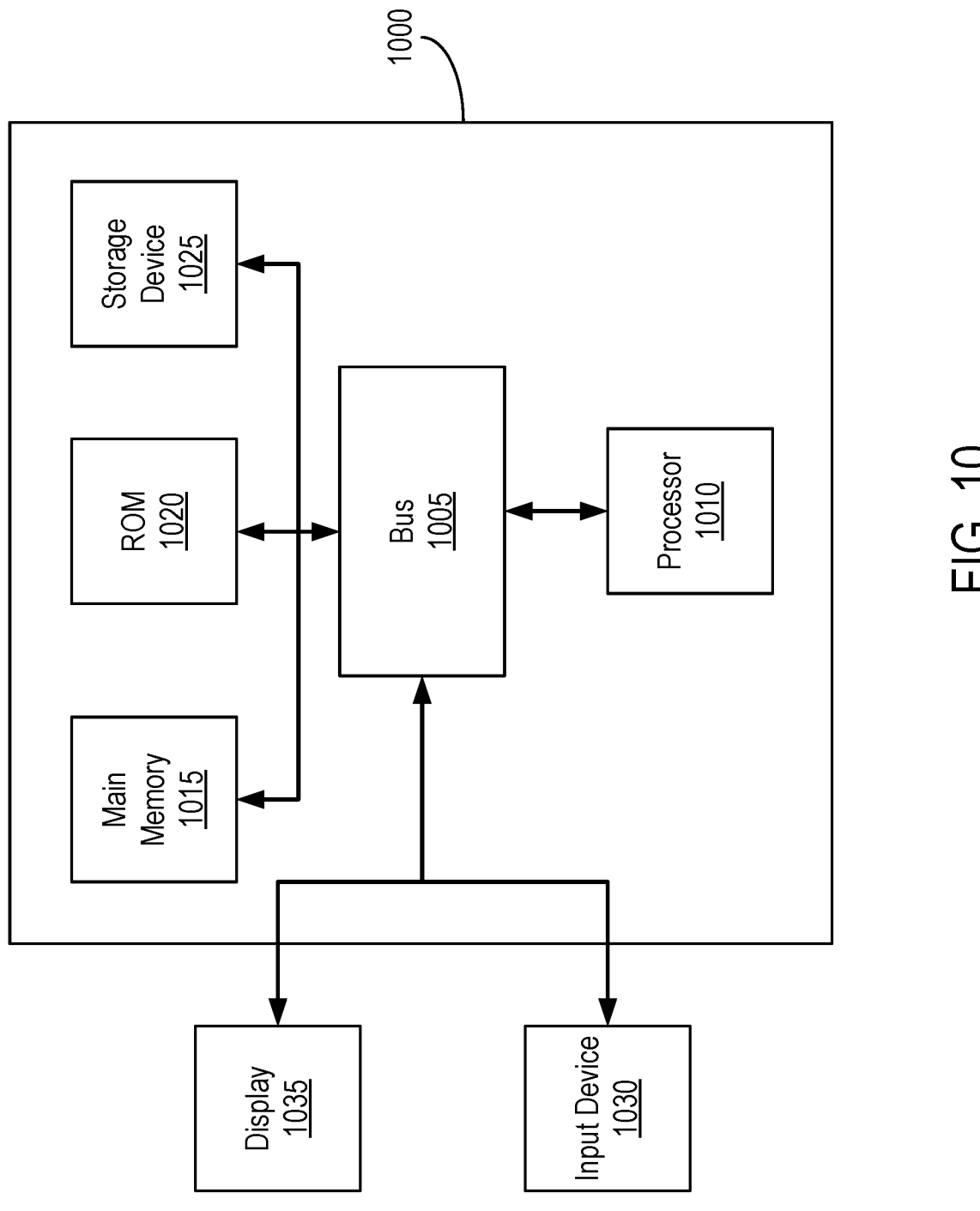
FIG. 10 is a block diagram illustrating an architecture for a computer system that can be employed to implement elements of the systems and methods described and illustrated herein, including, for example, the systems depicted in FIG. 1, or operations, examples, or methods depicted in FIGS. 3-9.

FIG. 10 is a block diagram of an example computer system 1000. The computer system or computing device 1000 can include or be used to implement the data processing system 102, or its components such as the data processing system 102. The computing system 1000 includes at least one bus 1005 or other communication component for communicating information and at least one processor 1010 or processing circuit coupled to the bus 1005 for processing information. The computing system 1000 can also include one or more processors 1010 or processing circuits coupled to the bus for processing information. The computing system 1000 also includes at least one main memory 1015, such as a random access memory (RAM) or other dynamic storage devices, coupled to the bus 1005 for storing information, and instructions to be executed by the processor 1010. The main memory 1015 can be or include the memory or storage device. The main memory 1015 can also be used for storing various parameters information related to the manufacturing equipment, or other information during execution of instructions by the processor 1010. The computing system 1000 may further include at least one read only memory (ROM) 1020 or other static storage device coupled to the bus 1005 for storing static information and instructions for the processor 1010. A storage device 1025, such as a solid state device, magnetic disk or optical disk, can be coupled to the bus 1005 to persistently store information and instructions.

The computing system 1000 may be coupled via the bus 1005 to a display 1035, such as a liquid crystal display, or active matrix display, for displaying information to a user (e.g., via a GUI), who may be an operator of the manufacturing equipment. An input device 1030, such as a keyboard or voice interface may be coupled to the bus 1005 for communicating information and commands to the processor 1010. The input device 1030 can include a touch screen display 1035. The input device 1030 can also include a cursor control, such as a mouse, a trackball, or cursor direction keys, for communicating direction information and command selections to the processor 1010 and for controlling cursor movement on the display 1035. The display 1035 can be part of the data processing system 102, or other components of FIG. 1.

The processes, systems, and methods described herein can be implemented by the computing system 1000 in response to the processor 1010 executing an arrangement of instructions contained in main memory 1015. Such instructions can be read into main memory 1015 from another computer-readable medium, such as the storage device 1025. Execution of the arrangement of instructions contained in main memory 1015 causes the computing system 1000 to perform the illustrative processes described herein. One or more processors in a multi-processing arrangement may also be employed to execute the instructions contained in main memory 1015. Hard-wired circuitry can be used in place of or in combination with software instructions together with the systems and methods described herein. Systems and methods described herein are not limited to any specific combination of hardware circuitry and software.

Although an example computing system has been described in FIG. 10, the subject matter including the operations described in this specification can be implemented in other types of digital electronic circuitry, or in computer software, firmware, or hardware, including the structures disclosed in this specification and their structural equivalents, or in combinations of one or more of them.

The systems described above can provide multiple ones of any or each of those components and these components can be provided on either a standalone system or on multiple instantiations in a distributed system. Any processing herein may be carried out by an integrated processor or distributed among multiple processors. In addition, the systems and methods described above can be provided as one or more computer-readable programs or executable instructions embodied on or in one or more articles of manufacture. The article of manufacture can be cloud storage, a hard disk, a CD-ROM, a flash memory card, a PROM, a RAM, a ROM, or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

The subject matter and the operations described in this specification can be implemented in digital electronic circuitry, or in computer software, firmware, or hardware, including the structures disclosed in this specification and their structural equivalents, or in combinations of one or more of them. The subject matter described in this specification can be implemented as one or more computer programs, e.g., one or more circuits of computer program instructions, encoded on one or more computer storage media for execution by, or to control the operation of, data processing apparatuses. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. While a computer storage medium is not a propagated signal, a computer storage medium can be a source or destination of computer program instructions encoded in an artificially generated propagated signal. The computer storage medium can also be, or be included in, one or more separate components or media (e.g., multiple CDs, disks, or other storage devices include cloud storage). The operations described in this specification can be implemented as operations performed by a data processing apparatus on data stored on one or more computer-readable storage devices or received from other sources.

The terms "computing device", "component" or "data processing apparatus" or the like encompass various apparatuses, devices, and machines for processing data, including by way of example a programmable processor, a computer, a system on a chip, or multiple ones, or combinations of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, app, script, or code) can be written in any form of programming language, including compiled or interpreted languages, declarative or procedural languages, and can be deployed in any form, including as a stand-alone program or as a module, component, subroutine, object, or other unit suitable for use in a computing environment. A computer program can correspond to a file in a file system. A computer program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatuses can also be implemented as, special purpose logic circuitry, e.g., an FPGA (field programmable gate array) or an ASIC (application specific integrated circuit). Devices suitable for storing computer program instructions and data can include non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The subject matter described herein can be implemented in a computing system that includes a back end component, e.g., as a data server, or that includes a middleware component, e.g., an application server, or that includes a front end component, e.g., a client computer having a graphical user interface or a web browser through which a user can interact with an implementation of the subject matter described in this specification, or a combination of one or more such back end, middleware, or front end components. The components of the system can be interconnected by any form or medium of digital data communication, e.g., a communication network. Examples of communication networks include a local area network (LAN) and a wide area network (WAN), an inter-network (e.g., the Internet), and peer-to-peer networks (e.g., ad hoc peer-to-peer networks).

While operations are depicted in the drawings in a particular order, such operations are not required to be performed in the particular order shown or in sequential order, and all illustrated operations are not required to be performed. Actions described herein can be performed in a different order.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

References to "or" may be construed as inclusive so that any terms described using "or" may indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Modifications of described elements and acts can occur without materially departing from the teachings and advantages of the subject matter disclosed herein. Other substitutions, modifications, changes and omissions can also be made in the design and arrangement of the disclosed elements and operations without departing from the scope of this disclosure.

The systems and methods described herein may be embodied in other specific forms without departing from the characteristics thereof. The foregoing implementations are illustrative rather than limiting of the described systems and methods. The scope of the systems and methods described herein may thus be indicated by the appended claims, rather than the foregoing description, and changes that come within the meaning and range of equivalency of the claims are embraced therein.

What is claimed is:

1. A system, comprising:

a data processing system comprising one or more processors and a memory, the data processing system being configured to:

receive first electrical data obtained from a first sensor positioned at a first terminal of a power source;

receive second electrical data obtained from a second sensor positioned at a second terminal of the power source;

determine a first average value from the first electrical data and a second average from the second electrical data;

determine a difference between the first average value and the second average value;

detect a fault impedance according to a pattern of the difference between the first average value and the second average value over a measured time interval; and responsive to detecting the fault impedance, provide, via a graphical user interface (GUI), an indication of the fault impedance.

2. The system of claim 1, wherein the first sensor and the second sensor are current sensors, wherein the first electrical data and the second electrical data are current data, and wherein the data processing system is configured to:

responsive to detecting the fault impedance, provide the indication of the fault impedance via a communication area network (CAN) to initiate a recovery action.

3. The system of claim 1, wherein the first average value and the second average value are associated with at least one trigger window.

4. The system of claim 1, wherein responsive to detecting the fault impedance, the data processing system is configured to:

send, to at least one gate driver associated with at least one respective transistor, a command to adjust electrical power to an electromechanical actuator, wherein the electromechanical actuator is electrically coupled to the power source via the at least one respective transistor.

5. The system of claim 1, wherein to detect the fault impedance, the data processing system is configured to:

increment a counter responsive to the difference being greater than or equal to an upper threshold or less than or equal to a lower threshold; and detect the fault impedance responsive to the counter being greater than or equal to a count threshold.

6. The system of claim 1, wherein to detect the fault impedance, the data processing system is configured to:

detect a location of the fault impedance according to the pattern of the difference between the first average value and the second average value over the measured time interval.

7. The system of claim 6, wherein the data processing system is configured to:

detect a first location of the fault impedance responsive to the difference being lower than or equal to a lower threshold for a predetermined number of consecutive cycles.

8. The system of claim 6, wherein the data processing system is configured to:

detect a second location of the fault impedance responsive to a modulation of the difference between being lower than or equal to a lower threshold and zero for a predetermined number of cycles.

9. The system of claim 6, wherein the data processing system is configured to:

detect a third location of the fault impedance responsive to the difference being greater than or equal to an upper threshold for a predetermined number of cycles.

10. The system of claim 1, wherein the data processing system being configured to:

determine a first maximum value from the first electrical data and a second maximum value from the second electrical data;

detect a first fault responsive to the first maximum value or the second maximum value being greater than or equal to a predetermined first threshold; and responsive to detecting the first fault, send, to at least one gate driver, a command to disable at least one transistor associated with the at least one gate driver.

11. The system of claim 1, wherein the data processing system being configured to:

determine a first maximum value from the first electrical data and a second maximum value from the second electrical data;

detect a second fault responsive to the first maximum value or the second maximum value being greater than or equal to a predetermined second threshold, wherein the predetermined second threshold is lower than a predetermined first threshold; and responsive to detecting the second fault, send, to at least one gate driver associated with at least one respective transistor, a command to reduce electrical power for supply to an electromechanical actuator.

12. A circuit, comprising:

a power source;

a first sensor positioned at a first terminal of the power source;

a second sensor positioned at a second terminal of the power source; and a data processing system comprising one or more processors and a memory, the data processing system being configured to receive first electrical data obtained from the first sensor;

receive second electrical data obtained from the second sensor;

determine a first average value from the first electrical data and a second average value from the second electrical data;

determine a difference between the first average value and the second average value;

detect a fault impedance according to a pattern of the difference between the first average value and the second average value over a measured time interval; and responsive to detecting the fault impedance, provide, via a graphical user interface (GUI), an indication of the fault impedance.

13. The circuit of claim 12, further comprising:

at least one gate driver;

at least one transistor associated with the at least one gate driver; and an electromechanical actuator, wherein responsive to detecting the fault impedance, the data processing system is configured to:

send, to the at least one gate driver, a command to adjust electrical power to the electromechanical actuator, wherein the electromechanical actuator is electrically coupled to the power source via the at least one respective transistor.

14. The circuit of claim 12, wherein to detect the fault impedance, the data processing system is configured to:

increment a counter responsive to the difference being greater than or equal to an upper threshold or less than or equal to a lower threshold; and detect the fault impedance responsive to the counter being greater than or equal to a count threshold.

15. A method, comprising:

receiving, by a data processing system comprising one or more processors and a memory, first electrical data obtained from a first sensor positioned at a first terminal of a power source;

receiving, by the data processing system, second electrical data obtained from a second sensor positioned at a second terminal of the power source;

determining, by the data processing system, a first average value from the first electrical data and a second average value from the second electrical data;

determining, by the data processing system, a difference between the first average value and the second average value;

detecting, by the data processing system, a fault impedance according to a pattern of the difference between the first average value and the second average value over a measured time interval; and responsive to detecting the fault impedance, providing, by the data processing system, via a graphical user interface (GUI), an indication of the fault impedance.

16. The method of claim 15, wherein detecting the fault impedance comprises:

detecting, by the data processing system, a location of the fault impedance according to the pattern of the difference between the first average value and the second average value over the measured time interval.

17. The method of claim 16, further comprising:

detecting, by the data processing system, a first location of the fault impedance responsive to the difference being lower than or equal to a lower threshold for a predetermined number of consecutive cycles.

18. The method of claim 16, further comprising:

detecting, by the data processing system, a second location of the fault impedance responsive to a modulation of the difference between being lower than or equal to a lower threshold and zero for a predetermined number of cycles.

19. The method of claim 16, further comprising:

detecting, by the data processing system, a third location of the fault impedance responsive to the difference being greater than or equal to an upper threshold for a predetermined number of cycles.

20. The method of claim 15, comprising:

determining, by the data processing system, a first maximum value from the first electrical data and a second maximum value from the second electrical data;

detecting, by the data processing system, a first fault responsive to the first maximum value or the second maximum value being greater than or equal to a predetermined first threshold; and responsive to detecting the first fault, sending, by the data processing system, to at least one gate driver, a command to disable at least one transistor associated with the at least one gate driver.

* * * * *